United States Patent [19]
Sunouchi

[11] Patent Number: 6,031,260
[45] Date of Patent: Feb. 29, 2000

[54] SEMICONDUCTOR MEMORY DEVICE AND METHOD FOR MANUFACTURING THE SAME

[75] Inventor: Kazumasa Sunouchi, Yokohama, Japan

[73] Assignee: Kabushiki Kaisha Toshiba, Kawasaki, Japan

[21] Appl. No.: 08/698,086

[22] Filed: Aug. 15, 1996

[30] Foreign Application Priority Data

Sep. 19, 1995 [JP] Japan .................................. 7-240336

[51] Int. Cl.⁷ .................................................. H01L 27/108
[52] U.S. Cl. ........................... 257/296; 257/303; 257/306
[58] Field of Search .................................. 257/296, 303, 257/306, 68, 71; 438/152, 155, 164, 253

[56] References Cited

U.S. PATENT DOCUMENTS

| | | | |
|---|---|---|---|
| 4,630,088 | 12/1986 | Ogura et al. ........................... | 357/23.6 |
| 5,424,235 | 6/1995 | Nishihara .................................. | 437/52 |
| 5,585,284 | 12/1996 | Park ......................................... | 437/21 |

FOREIGN PATENT DOCUMENTS

| | | |
|---|---|---|
| 0 475 280 | 3/1992 | European Pat. Off. . |
| 61-67953 | 4/1986 | Japan . |
| 1-149452 | 6/1989 | Japan . |
| 4-225276 | 8/1992 | Japan . |
| 4-237131 | 8/1992 | Japan . |
| 4-280469 | 10/1992 | Japan . |
| 4-282865 | 10/1992 | Japan . |
| 7-161835 | 6/1995 | Japan . |

*Primary Examiner*—Sara Crane
*Attorney, Agent, or Firm*—Oblon, Spivak, McClelland, Maier & Neustadt, P.C.

[57] ABSTRACT

A semiconductor memory device includes a substrate, a first insulation layer formed on the substrate, a plurality of bit lines arranged on the first insulation layer, a second insulation layer formed all over the bit lines and having a plurality of first openings, an element isolating region formed on the second insulation layer, a plurality of island-like element forming semiconductor regions formed as surrounded by the element isolating region, a plurality of transistors respectively formed in the element forming semiconductor regions, and a plurality of capacitors respectively formed on the transistors. Each of the transistors includes a gate electrode insulatively formed on the element forming region, and a first and a second diffusion region formed on either side of the gate electrode, the first diffusion region being connected to a corresponding one of the bit lines through a via conductor formed in one of the first openings. Each of the capacitors has a storage electrode formed on the second diffusion region of each of the transistors.

9 Claims, 19 Drawing Sheets

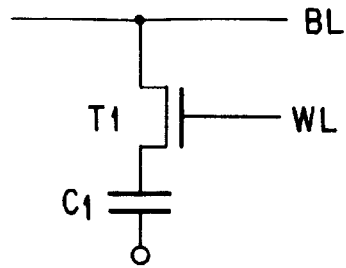
F I G. 1
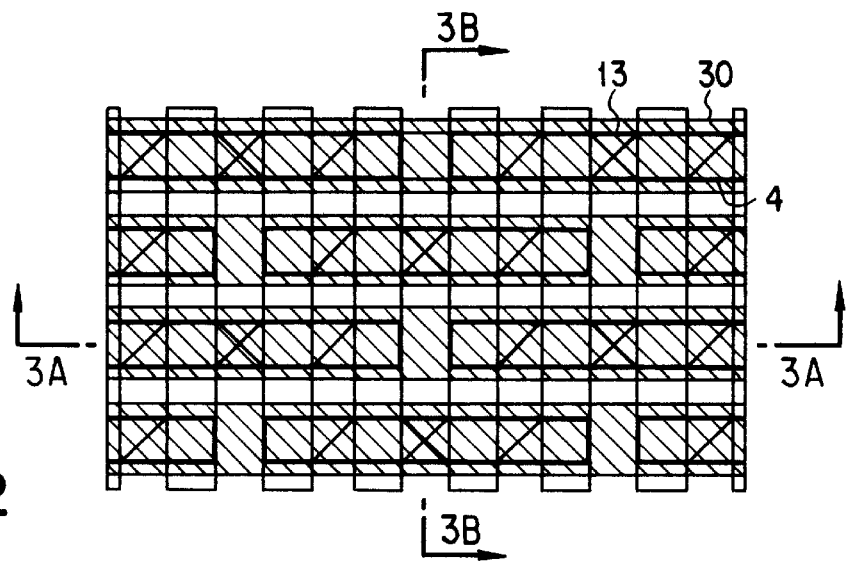
F I G. 2
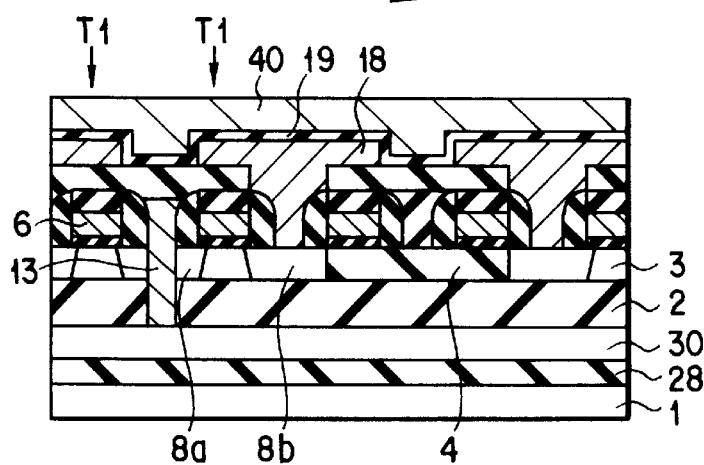
F I G. 3A
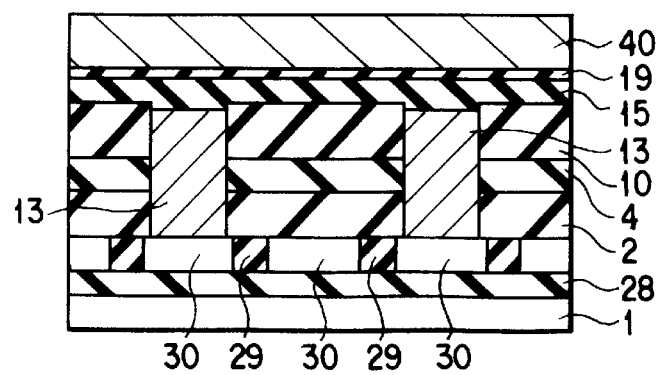
F I G. 3B

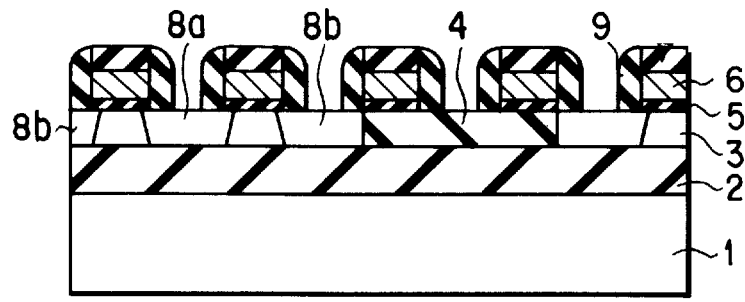
F I G. 22A
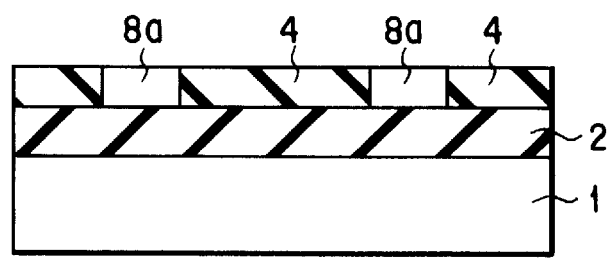
F I G. 22B
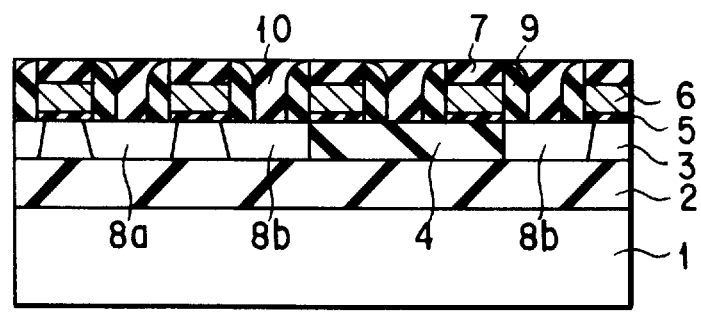
F I G. 23A
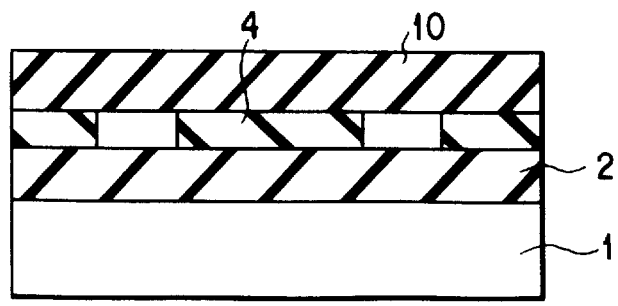
F I G. 23B

SEMICONDUCTOR MEMORY DEVICE AND METHOD FOR MANUFACTURING THE SAME

BACKGROUND OF THE INVENTION

1. Field of the Invention

The present invention relates to a high degree of integration of a semiconductor memory device and, more specifically, to a semiconductor memory device including memory cells formed on an SOI (Silicon On Insulator) substrate.

2. Description of the Related Art

In a semiconductor integrated circuit, especially, a semiconductor memory device such as a DRAM, the area of memory cells has recently been decreased more and more in accordance with a remarkably high degree of integration. This necessitates miniaturizing charge storage layers constituting the memory cells, transistors, and element isolation regions each formed between the memory cells, thus causing various problems. For example, if the area of the charge storage layers is reduced, a sufficient amount of charge cannot be stored, the transistors are difficult to control, and an isolation withstand voltage cannot be obtained sufficiently between the memory cells.

Various methods for resolving the above problems have been considered and put to practical use. For instance, the area of the charge storage layers can be secured by forming the layers above both the transistors and bit lines. If the memory cells are formed on an island-like semiconductor substrate insulatively formed in an insulation film, the isolation withstand voltage can be enhanced, and the short channel effect can be suppressed, thereby improving in controllability of the transistors.

A conventional stacked capacitor type memory cell adopting the above method has, for example, the following structure. An insulation layer is formed on a semiconductor substrate, and a monocrystalline silicon layer is formed on the insulation layer. To form the monocrystalline silicon layer on the insulation layer is called the SOI structure. The monocrystalline silicon layer is surrounded with an element isolation region reaching the insulation layer thereby to form an element region. The element region is isolated like an island, and a gate insulation film is selectively formed in the isolated element region. A gate electrode is formed on the gate insulation film, and two diffusion layers (source and drain regions) are formed on the surface of the element region so as to interpose the gate electrode therebetween. These gate insulation film, gate electrode and diffusion layers constitute a transistor. One of the source and drain regions of the transistor is connected to a bit line formed above the gate electrode. The other one of the source and drain regions is connected to a storage electrode formed thereon. The storage electrode is opposite to a plate electrode formed higher than the bit line, thus constituting a capacitor (see FIG. 15).

In the conventional memory cell, signal data transmitted through the bit line is stored in the storage electrode through the transistor, and the data stored in the electrode is read out and supplied to the bit line through the transistor.

As described above, in the conventional memory cell, since a transistor is formed on the semiconductor substrate isolated in the insulation film, the short channel effect can be suppressed and the element isolation withstand voltage can be increased. Since, furthermore, a capacitor can be formed on the gate electrode and the bit line, the area for the capacitor can be secured. Consequently, various problems due to miniaturization of memory cells can be resolved.

However, in the conventional memory cell, the storage electrode is formed so as to cover the bit line with the insulation film interposed therebetween, a very deep connecting hole has to be opened in order to connect the storage electrode to one of the source and drain regions. The miniaturization of memory cells makes it very difficult to prevent the storage electrode from being short-circuited with the gate electrode and the bit line, and the connecting hole is required to be very correctly self-aligned with the gate electrode and the bit line.

Conventionally, it is considerably difficult to manufacture a memory cell having an area enough to form a capacitor and having a transistor improved in element isolation withstand voltage and in controllability, without causing the storage electrode to be short-circuited with the gate electrode and the bit line.

SUMMARY OF THE INVENTION

A first object of the present invention is to provide a semiconductor memory device in which a large area for forming a capacitor is secured, a transistor is excellent in element isolation withstand voltage and controllability, a storage electrode can be prevented from being short-circuited with a gate electrode and a bit line.

A second object of the present invention is to provide a method for manufacturing a semiconductor device having the above constitution.

To attain the above object, according to a first aspect of the present invention, there is provided a semiconductor memory device comprising:

a substrate;

a first insulation layer formed on the substrate;

a plurality of bit lines arranged in one direction on the first insulation layer and separated from one another;

a second insulation layer formed all over the plurality of bit lines and having a plurality of openings;

a plurality of via conductive layers buried into at least the plurality of openings;

an element isolating region formed on the second insulation layer;

a plurality of island-like element forming semiconductor regions formed as surrounded by the element isolating region;

a plurality of transistors formed in the plurality of island-like element forming semiconductor regions, each of the plurality of transistors including:

a gate electrode insulatively formed on a corresponding one of the plurality of island-like element forming semiconductor regions, the gate electrode extending in a direction crossing the plurality of bit lines and serving as a word line;

a first and a second diffusion region formed on both sides of the gate electrode in a direction crossing the word line and formed on the one of the plurality of island-like element forming semiconductor regions, the first diffusion region being connected to a corresponding one of the plurality of bit lines through a corresponding one of the plurality of via conductive layers; and a plurality of capacitors corresponding to the plurality of transistors, each of the plurality of capacitors including:

a storage electrode formed on the second diffusion region, the storage electrode being electrically connected to the second diffusion region;

a capacitor insulation film formed on the storage electrode; and a plate electrode formed on the capacitor insulation film, the plate electrode being connected in common to the plurality of capacitors.

It is preferable that the bit lines be formed of tungsten.

The bit lines can also be formed of monocrystalline silicon, and the island-like element forming semiconductor regions and via conductive layers can be formed integrally with the bit lines as a monocrystalline layer and, in this case, the monocrystalline layer needs to be doped.

In the semiconductor memory device according to the first aspect of the present invention, since the bit lines are formed under the semiconductor layer, in which the MOS transistor is formed, with the insulation layer therebetween, it is less possible that a short circuit will occur between the bit lines and storage electrode than in the prior art structure wherein the bit lines are interposed between the storage electrode and semiconductor layer. Since the semiconductor layer is isolated like an island on the insulation layer, both transistor controllability and element isolation withstand voltage can be improved. Since, furthermore, the capacitor including the storage and plate electrodes is formed on the top of the structure, sufficient charges can be stored by effectively utilizing the area of the memory cell, with the result that the semiconductor memory device can be improved in performance.

According to a second aspect of the present invention, there is provided a semiconductor memory device comprising:

a substrate;

an insulation layer formed on the substrate and having a plurality of openings;

a plurality of via conductive layers buried into at least the plurality of openings;

an element isolating region formed on the insulation layer;

a plurality of island-like element forming semiconductor regions formed as surrounded by the element isolating region;

a plurality of transistors formed in the plurality of island-like element forming semiconductor regions, each of the plurality of transistors including:

a gate electrode insulatively formed on a corresponding one of the plurality of island-like element forming semiconductor regions, the gate electrode extending in a predetermined direction and serving as a word line;

a first and a second diffusion region formed on both sides of the gate electrode in a direction crossing the word line and formed in the one of the plurality of island-like element forming semiconductor regions, the first diffusion region being connected to the substrate through a corresponding one of the plurality of via conductive layers; and a plurality of capacitors corresponding to the plurality of transistors, each of the plurality of capacitors including:

a storage electrode formed on the second diffusion region, the storage electrode being electrically connected to the second diffusion region;

a capacitor insulation film formed on at least the storage electrode; and a plate electrode formed on the capacitor insulation film, the plate electrode extending in a direction crossing the word line and serving as a bit line.

It is preferable that the substrate is formed of silicon, and the via conductive layers are each formed of one of polysilicon and tungsten.

It is preferable that a third diffusion region is selectively formed in a portion of the substrate under the one of the plurality of via conductive layers and connected thereto.

The substrate can also be formed of monocrystalline silicon, and the island-like element forming semiconductor regions and via conductive layers can be formed integrally with the substrate as a monocrystalline layer.

In the semiconductor memory device according to the second aspect of the present invention, the layer formed above the storage electrode through the insulation film serves as both the plate electrode and bit line. Therefore, the short circuit between the storage electrode and bit line can be prevented more easily than in the prior art structure wherein the bit line is interposed between the storage electrode and semiconductor layer.

Of the diffusion layers of the MOS transistor, the diffusion layer, which is not connected to the storage electrode, is connected to the semiconductor substrate formed under the insulation layer, so that no wiring needs to be formed above the semiconductor layer. It is thus possible to avoid the problems of causing a short circuit to occur between the storage electrode and the wiring and decreasing the area of the storage electrode by the wiring.

Since, moreover, the semiconductor region in which the MOS transistor is formed is isolated like an island on the insulation layer as in the above semiconductor memory device of the first aspect, both transistor controllability and element isolation withstand voltage can be improved.

A method for manufacturing the semiconductor memory device according to the first aspect of the present invention, comprises the steps of:

forming a plurality of bit lines on a substrate with a first insulation layer therebetween;

forming a second insulation layer all over the plurality of bit lines;

forming a plurality of semiconductor regions isolated like an island on the second insulation layer;

forming a MOS transistor having a gate electrode insulatively formed on each of the plurality of semiconductor regions and a first and a second diffusion layer formed on both sides of the gate electrode and on each of the plurality of semiconductor regions;

forming a first interlayer insulation film so as to bury a periphery of the gate electrode;

selectively removing the first interlayer insulation film, a corresponding one of the plurality of semiconductor regions and the second insulation layer to form a first opening to expose a corresponding one of the plurality of bit lines;

burying a conductive material into the first opening to connect the first diffusion layer and a corresponding one of the plurality of bit lines;

forming a second interlayer insulation film on at least the conductive material;

selectively removing the first interlayer insulation film and forming a second opening so as to expose the second diffusion layer of the MOS transistor;

forming a storage electrode connected to the second diffusion layer;

forming a capacitor insulation film on the storage electrode; and forming a plate electrode on the capacitor insulation film.

It is preferable that the method further comprises a step of forming a third insulation layer on an upper surface and both sides of the gate electrode of the MOS transistor, wherein the step of forming the storage electrode includes a step of forming the storage electrode on the third insulation layer.

It is preferable that a step of forming the third diffusion layer on the surface of the exposed bit line be executed after the step of forming the first opening.

It is preferable that the conductive material be metal, and a step of forming the barrier metal layer be executed after the step of forming the third diffusion layer.

It is preferable that the step of forming the second insulation layer should include a step of forming the insulation film so as to cover the bit lines and polishing and flattening the surface of the insulation film.

It is preferable that in the step of forming the first opening, the first interlayer insulation film be etched in the condition that only the first interlayer insulation film is etched, substantially without etching the third insulation layer.

It is preferable that in the step of forming the second opening, the second and the first interlayer insulation film be etched in the condition that only the second and the first interlayer insulation film is etched, substantially without etching the third insulation layer.

According to the manufacturing method of the semiconductor memory device of the first aspect, the storage electrode is formed after both the insulation layer and semiconductor layer are formed on the bit lines and the MOS transistor is formed on the semiconductor layer. Since, therefore, no bit lines are present between the storage electrode and substrate when the storage electrode is formed, the bit lines and storage electrode can be prevented from being short-circuited with each other.

A method for manufacturing the semiconductor memory device according to the second aspect of the present invention, comprises the steps of:

forming a plurality of semiconductor regions isolated like an island on a first insulation layer formed on a substrate;

forming a MOS transistor having a gate electrode insulatively formed on each of the plurality of semiconductor regions and a first and a second diffusion layer formed on both sides of the gate electrode and on each of the plurality of semiconductor regions;

forming a first interlayer insulation film so as to bury a periphery of the gate electrode;

selectively removing the first interlayer insulation film, a corresponding one of the plurality of semiconductor regions and the first insulation layer to form a first opening to expose the substrate;

burying a conductive material into the first opening to connect the first diffusion layer and the substrate;

forming a second interlayer insulation film on at least the material;

selectively removing the first interlayer insulation film and forming a second opening so as to expose the second diffusion layer of the MOS transistor;

forming a storage electrode connected to the second diffusion layer;

forming a capacitor insulation film on at least the storage electrode; and forming a plurality of plate electrodes on the capacitor insulation film, the plurality of plate electrodes serving as a plurality of bit lines.

It is preferable that the method further comprises a step of forming a second insulation layer on an upper surface and both sides of the gate electrode of the MOS transistor, wherein the step of forming the storage electrode includes a step of forming the storage electrode on the second insulation layer.

It is preferable that the substrate be a semiconductor substrate and the step of forming the third diffusion layer on the surface of the exposed semiconductor substrate be executed after the step of forming the first opening.

It is preferable that the conductive material be metal and the step of forming the barrier metal layer be executed after the step of forming the third diffusion layer.

It is preferable that in the step of forming the first opening, the first interlayer insulation film be etched in the condition that only the first interlayer insulation film is etched, substantially without etching the second insulation layer.

It is preferable that in the step of forming the second opening, the second and the first interlayer insulation film be etched in the condition that only the second and the first interlayer insulation film is etched, substantially without etching the second insulation layer.

According to the manufacturing method of the semiconductor memory device of the second aspect, the storage electrode is formed, the insulation film is formed thereon, and the plate electrode is formed on the insulation film. No bit lines are therefore present between the storage electrode and substrate when the storage electrode is formed, and the bit lines and storage electrode can be prevented from being short-circuited with each other.

Of the diffusion layers of the MOS transistor, the diffusion layer, which is not connected to the storage electrode, is connected to the semiconductor substrate formed under the insulation layer before the storage electrode is formed, so that no wiring needs to be formed above the semiconductor region. It is thus possible to avoid the problems of causing the storage electrode to be short-circuited with the wiring and decreasing the area of the storage electrode by the wiring.

Another method for manufacturing the semiconductor memory device of the second aspect of the present invention, that is, a manufacturing method according to a third aspect of the present invention comprises the steps of:

selectively removing a first insulation layer formed on a semiconductor substrate, and forming a first opening so as to expose the semiconductor substrate;

forming a plurality of semiconductor regions isolated like an island on the first insulation layer so as to be connected to the semiconductor substrate;

forming a MOS transistor having a gate electrode insulatively formed on each of the plurality of semiconductor regions and a first and a second diffusion layer formed on both sides of the gate electrode and on each of the plurality of semiconductor regions, the first diffusion layer being connected to the semiconductor substrate through the first opening;

forming a first interlayer insulation film so as to bury a periphery of the gate electrode;

selectively removing the first interlayer insulation film, and forming a second opening so as to expose the second diffusion layer of the MOS transistor;

forming a storage electrode connected to the second diffusion layer;

forming a capacitor insulation film on at least the storage electrode; and forming a plurality of plate electrodes on the capacitor insulation film, the plurality of plate electrodes serving as a plurality of bit lines.

It is preferable that the method further comprises a step of forming a second insulation layer on an upper surface and both sides of the gate electrode of the MOS transistor, wherein the step of forming the storage electrode includes a step of forming the storage electrode on the second insulation layer.

It is preferable that in the step of forming the plurality of semiconductor regions, the semiconductor region be epitaxially grown using the semiconductor substrate exposed as seed crystal.

It is preferable that in the step of forming the second opening, the first interlayer insulation film be etched in the condition that only the first interlayer insulation film is etched, substantially without etching the second insulation layer.

As in the foregoing manufacturing method of the semiconductor device of the second aspect, since the plate electrodes for constituting the bit lines are formed on the insulation film on the storage electrode, no bit lines are present between the storage electrode and substrate when the storage electrode is formed. It is thus possible to prevent the bit lines and storage electrode from being short-circuited with each other.

Since, furthermore, the semiconductor substrate formed under the insulation layer and the diffusion regions are connected before the MOS transistor is formed on the insulation film, a connecting electrode can be prevented from being short-circuited with the MOS transistor when the connecting electrode is formed, unlike the manufacturing method of the device of the second aspect, wherein the substrate and diffusion regions are connected after the MOS transistor is formed.

The manufacturing method according to the third aspect using monocrystal growth can be applied to that of the device according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is an equivalent circuit diagram of one memory cell of a semiconductor memory device according to a first embodiment of the present invention;

FIG. 2 is a schematic plan view of the semiconductor memory device according to the first embodiment of the present invention;

FIG. 3A is a cross-sectional view taken along line 3A—3A of FIG. 2;

FIG. 3B is a cross-sectional view taken along line 3B—3B of FIG. 2;

FIGS. 4A to 14A and 4B to 14B are cross-sectional views showing step by step a method for manufacturing the semiconductor memory device according to the first embodiment of the present invention, the views of FIGS. 4A to 14A each corresponding to the view taken along line 3A—3A of FIG. 2, while those of FIGS. 4B to 14B each corresponding to the view taken along line 3B—3B of FIG. 2;

FIGS. 20A to 28A and 20B to 28B are crosssectional views showing step by step a method for manufacturing the semiconductor memory device according to the second embodiment of the present invention, the views of FIGS. 20A to 28A each corresponding to the view taken along line 18A—18A of FIG. 17, while those of FIGS. 20B to 28B each corresponding to the view taken along line 18B—18B of FIG. 17;

FIGS. 33A to 38A and 33B to 38B are cross-sectional views showing step by step a method for manufacturing the semiconductor memory device according to the third embodiment of the present invention, the views of FIGS. 33A to 38A each corresponding to the view taken along line 18A—18A of FIG. 17, while those of FIGS. 33B to 38B each corresponding to the view taken along line 18B—18B of FIG. 17.

DETAILED DESCRIPTION OF THE PREFERRED EMBODIMENTS

Figure 4A:
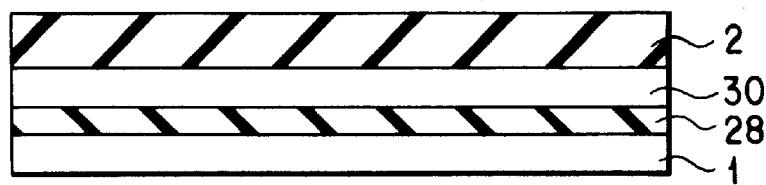

Embodiments of the present invention will now be described with reference to the accompanying drawings.
(First Embodiment)

FIG. 1 is an equivalent circuit diagram of one memory cell of a semiconductor memory device according to a first embodiment of the present invention, FIG. 2 is a plan view of the memory cell, FIG. 3A is a cross-sectional view taken along line 3A—3A of FIG. 2, and FIG. 3B is a cross-sectional view taken along line 3B—3B of FIG. 2.

As is apparent from FIG. 1, the equivalent circuit of the memory cell of the first embodiment is the same as that of a generally-used memory cell. In this circuit, a bit line BL is connected to, for example, the drain of a transistor T1, and the source of the transistor T1 is connected to a capacitor C1. The gate of the transistor T1 is connected to a word line WL.

In the memory cell shown in FIGS. 3A and 3B, a bit line 30 is formed not above a gate electrode 6 but under an insulation layer 2 of an SOI substrate, unlike a conventional bit line.

The bit line 30 is connected to a (source or drain) diffusion layer 8*a* of the transistor by a buried electrode 13 formed through the insulation layer 2. A plate electrode 40 is formed on a storage electrode 18 with a capacitor insulation film 19 therebetween, thereby constituting a storage capacitor. The storage electrode 18 is connected to another diffusion layer 8*b* of the transistor.

FIGS. 4A to 14A and 4B to 14B are cross-sectional views showing step by step a method for manufacturing the semiconductor memory device according to the first embodiment. The views of FIGS. 4A to 14A are each corresponding to the view taken along line 3A—3A of FIG. 2, while those of FIGS. 4B to 14B are each corresponding to the view taken along line 3B—3B of FIG. 2.

Figure 4B:
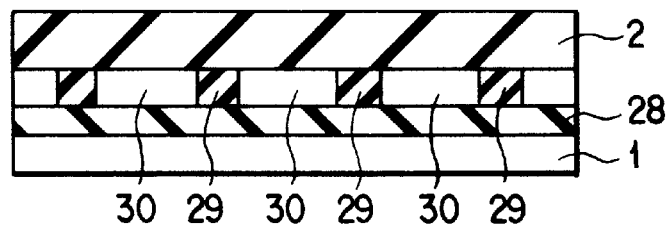
Figure 5A:
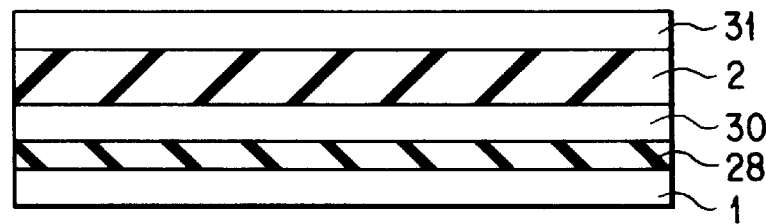
Figure 5B:
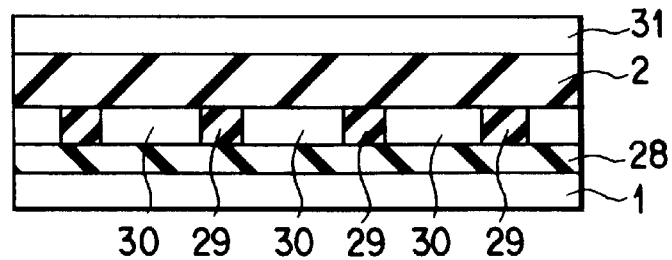

An insulation layer 28 of an oxide film ($SiO_2$) or the like is formed on a semiconductor substrate 1 such as a silicon substrate. Bit line materials such as tungsten are deposited on the insulation layer 28 thereby to form a bit line 30 using conventional photolithography and anisotropic etching such as RIE (Reactive Ion Etching). Insulation films 29 and 2 are formed by oxide films or the like so as to cover the bit line 30, and the surface of the insulation film 2 is flattened. (FIGS. 4A and 4B)

The bit line 30 can also be obtained by forming an insulation film having grooves on the insulation layer 28 and burying the bit line materials in the grooves.

Figure 6A:
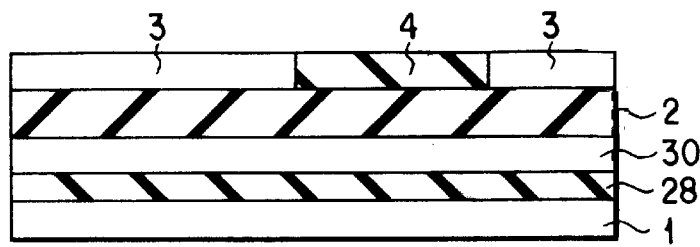
Figure 6B:
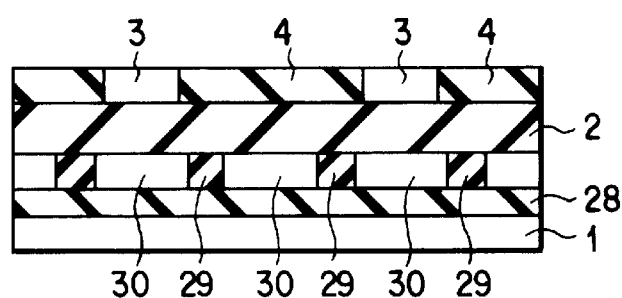

A silicon substrate 31 is stuck on the insulation film 2 by a sticking method and its surface is polished to form an SOI substrate including an element forming region 31 having a desired thickness. (FIGS. 5A and 5B) Part of the element forming region 31 is removed, and an insulation film such as an oxide film ($SiO_2$) is buried into the removed part, with the result that an element isolation region 4 reaching the insulation film 2 is formed and so is an island-like element region 3 surrounded with the film 2 and region 4. (FIGS. 6A and 6B)

Figure 7A:
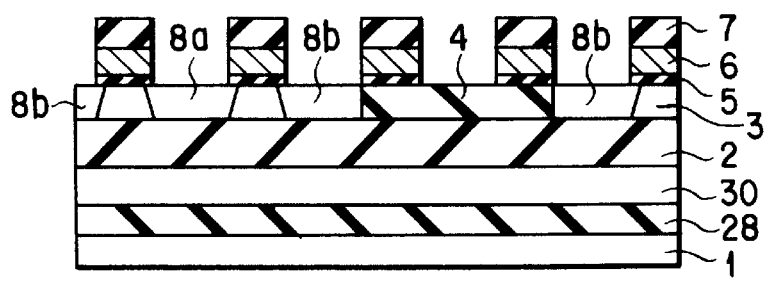
Figure 7B:
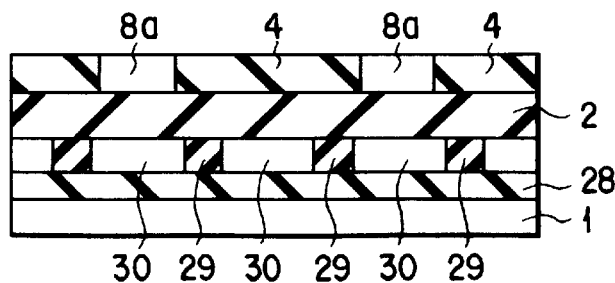

A gate insulation film 5 of, e.g., an oxide film ($SiO_2$) is formed on the resultant structure, and an electrode material such as a polysilicon film and an insulation film 7 such as a silicon nitride film (SiN) are formed one on another. A gate electrode 6 is obtained using conventional photolithography and anisotropic etching such as RIE. Furthermore, n-type diffusion layers 8*a* and 8*b* are formed by, e.g., ion implantation to serve as source and drain regions of the transistor. (FIGS. 7A and 7B)

Figure 8A:
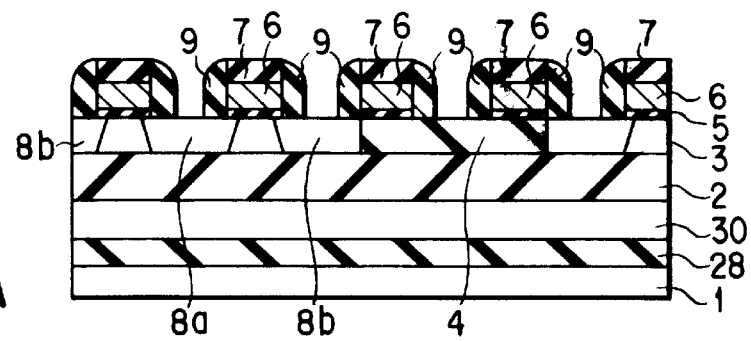
Figure 8B:
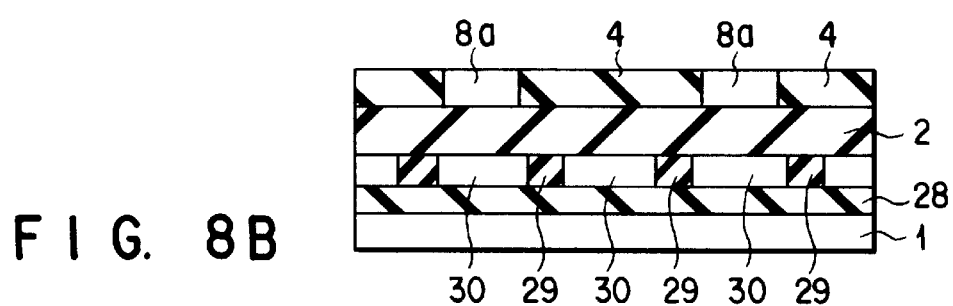

An insulation film such as a silicon nitride film is deposited on the resultant structure and then etched by anisotropic etching such as RIE, thereby forming insulation films 9 on the side walls of the gate electrode 6. (FIGS. 8A and 8B)

Figure 9A:
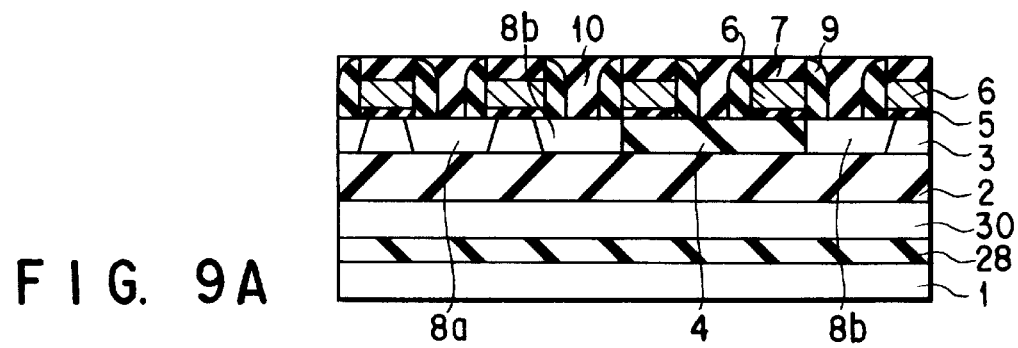
Figure 9B:
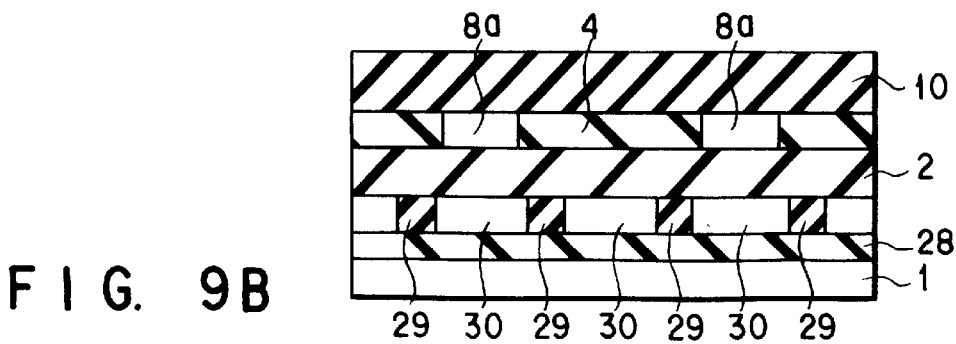

An interlayer insulation film 10 of, e.g., an oxide film ($SiO_2$) is deposited and polished by CMP (Chemical Mechanical Polishing) to expose the insulation (nitride) film 7 on the gate electrode 6, with the result that the film 10 is buried between adjacent gate electrodes 6. (FIGS. 9A and 9B)

Figure 10A:
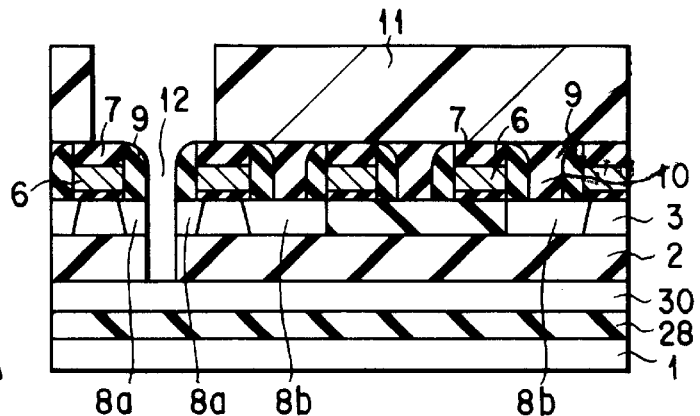
Figure 10B:
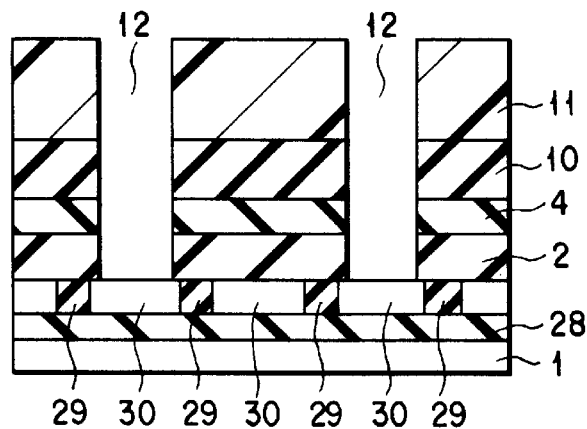

A resist film 11 having an opening is formed on the diffusion layer 8*a*. Using anisotropic etching such as RIE, the diffusion layer 8*a* and insulation film 2 are etched to expose the bit line 30, thus forming an opening 12. If an etching condition is set properly to prevent the nitride films 7 and 9 from being etched, the opening 12 is self-aligned with the gate electrode 6. (FIGS. 10A and 10B)

Figure 11A:
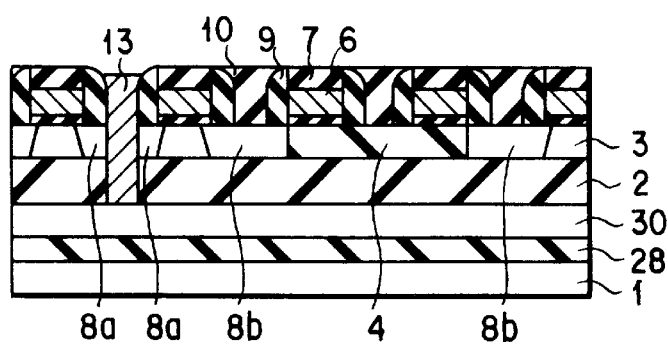
Figure 11B:
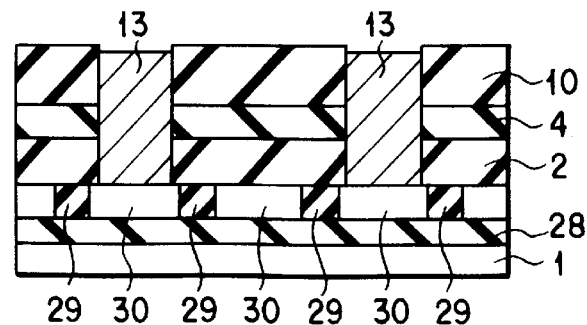

After the resist film 11 is eliminated, a polysilicon film containing, e.g., phosphorus is deposited. The insulation film 7 and interlayer insulation film 10 are exposed by etching the polysilicon film using, e.g., RIE, and the polysilicon film is thus buried into the opening 12. As a result, a buried electrode 13 is formed in the opening 12 to connect the diffusion layer 8*a* and bit line 30. (FIGS. 11A and 11B)

Figure 12A:
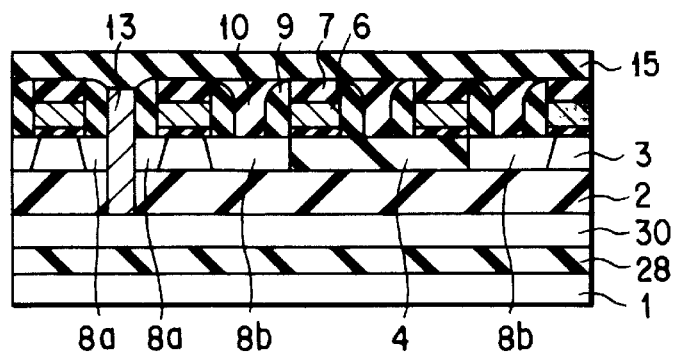
Figure 12B:
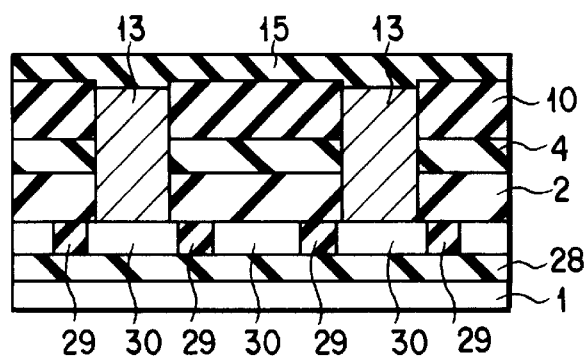

An interlayer insulation film 15 of an oxide film ($SiO_2$) or the like is deposited on the resultant structure. (FIGS. 12A and 12B)

Figure 13A:
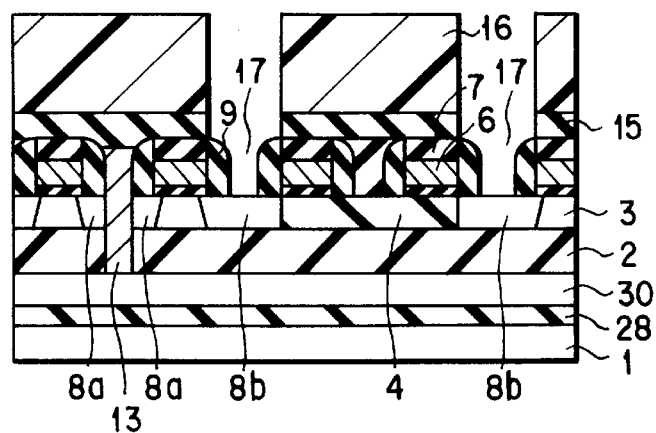
Figure 13B:
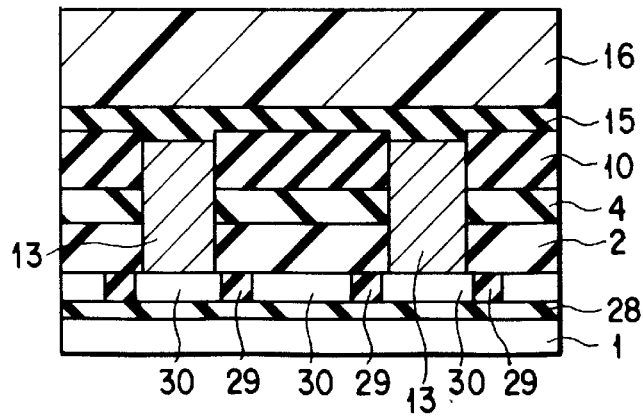

A resist film 16 having an opening above the diffusion layer 8*b* is formed on the interlayer insulation film 15, and the films 15 and 10 are etched to expose the diffusion layer 8*b*, thus forming a connecting hole 17 for a storage electrode. If an etching condition is set properly to prevent the nitride films 7 and 9 from being etched, the connecting hole 17 is self-aligned with the gate electrode 6. (FIGS. 13A and 13B)

Figure 14A:
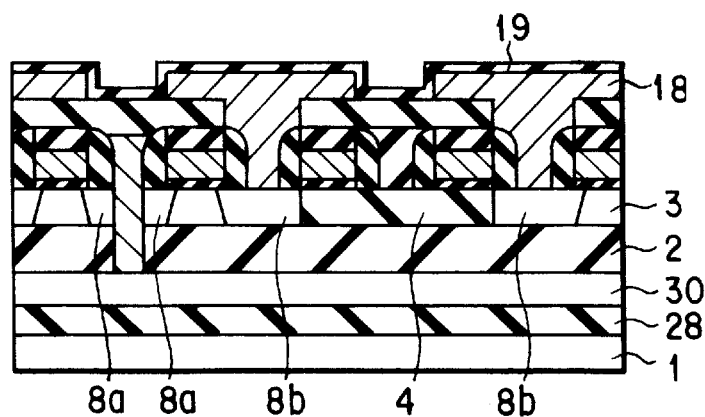
Figure 14B:
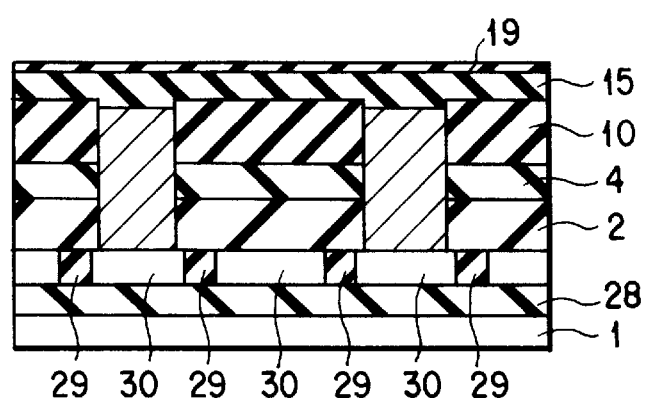

The resist film 16 is eliminated, an storage electrode material such as polysilicon containing phosphorus is deposited, and a storage electrode 18 is formed using conventional photolithography and anisotropic etching such as RIE. Using, e.g., LPCVD (Low Pressure Chemical Vapor Deposition), a silicon oxide film, a silicon nitride film, and a silicon oxide film are deposited to form a capacitor insulation film 19 of ONO (Oxide-Nitride-Oxide). (FIGS. 14A and 14B)

For example, a polysilicon film is deposited on the capacitor insulation film 19 as a plate electrode 40, thus completing a memory cell of DRAM as shown in FIGS. 3A and 3B.

The DRAM is finished by forming an interlayer insulation film, a wiring layer and the like through a conventional manufacturing process.

According to the first embodiment described above, since the bit line 30 is formed not above the gate electrode 6 but under the insulation layer 2 below the gate electrode 6, only the gate electrode 6 is present as a wiring layer between the storage electrode 18 and the diffusion layer 8*b* connected thereto when the storage electrode 18 is formed. As shown in FIGS. 13A and 13B, therefore, the connecting hole 17 has only to be self-aligned with the gate electrode 6 only, and the storage electrode 18 can easily be prevented from being short-circuited with the bit line 30.

Since the bit line 30 is also formed under the insulation layer 2 below an element region 3, the wiring layers formed above the region 3 can be decreased by one, as compared with those of the conventional device. Therefore, the interlayer insulation film to be etched can be thinned by the thickness of the bit line, though conventionally the interlayer insulation film has to be etched by at least the thicknesses of both the gate electrode and bit line when the connecting hole is formed. Since the interlayer insulation film to be etched is decreased in thickness, the connecting hole 17 can easily be self-aligned with the gate electrode 6.

Figure 15:
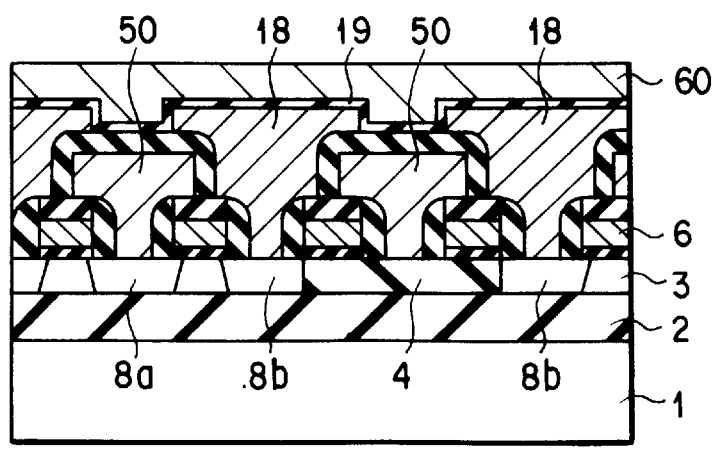
FIG. 15 is a cross-sectional view which is perpendicular to the bit line of a conventional semiconductor memory device.

FIG. 15 is a cross-sectional view of a prior art memory cell. In FIG. 15, a difference in level between a gate electrode 6 and a bit line 50 should be eliminated. However, according to the first embodiment of the present invention, since the difference can be reduced by at least the thickness of the bit line, a region, such as a peripheral circuit region, where no storage electrode is formed, can easily be flattened, thus facilitating patterning and etching of the wiring layer. In FIG. 15, reference numeral 60 indicates a plate electrode, and the other elements are the same as those of the first embodiment and denoted by the same numerals.

In the prior art memory cell, the bit line 50 is formed above the element region 3 in order to form the bit line 50, gate electrode 6 and storage electrode 18 within a small memory cell area. Thus, the distance between the bit line 50 and gate electrode 6 or between the bit line 50 and storage electrode 18 is very shortened, and they interfere with each other to make a noise or cause the memory cell to malfunction.

However, according to the first embodiment of the present invention, the bit line 30 is formed below the insulation layer 2 and separated from the gate electrode 6 or the storage electrode 18. Therefore, as compared with the prior art memory cell, these electrodes are hardly influenced by the bit line 30, and a DRAM having a larger operation margin can be formed.

According to the foregoing manufacturing method, the diffusion layer 8a can be self-aligned with the gate electrode 6, and the opening 12 can be self-aligned with the gate electrode 6 when the diffusion layer 8a is connected to the bit line 30. Consequently, no margin is newly required and the memory cell can be decreased in area.

(Second Embodiment)

A semiconductor device according to a second embodiment of the present invention will now be described. In this device, a plate electrode of a capacitor serves as a bit line, too.

Figure 16:
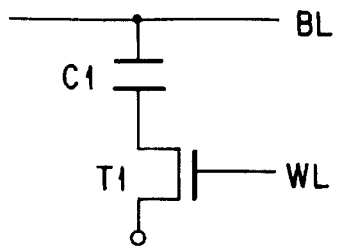
FIG. 16 is an equivalent circuit diagram of one memory cell of a semiconductor memory device according to a second embodiment of the present invention.
Figure 17:
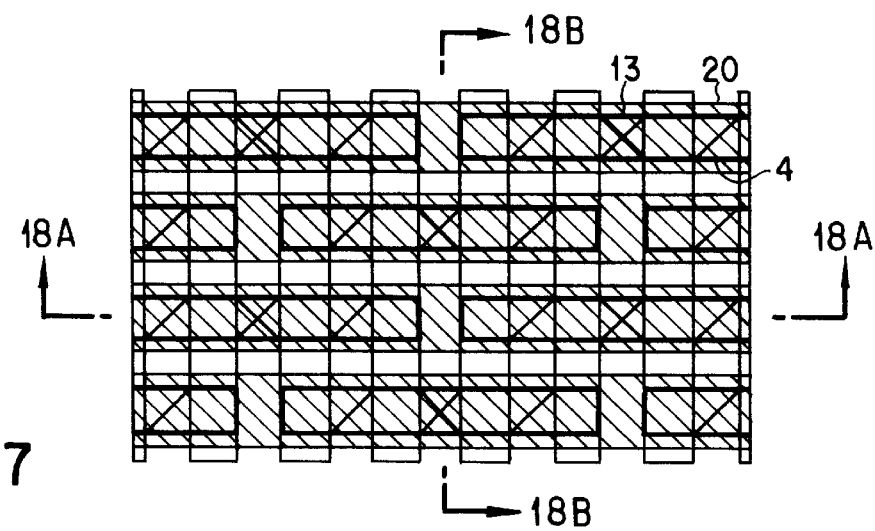
FIG. 17 is a schematic plan view of the semi-conductor memory device according to the second embodiment of the present invention.
Figure 18A:
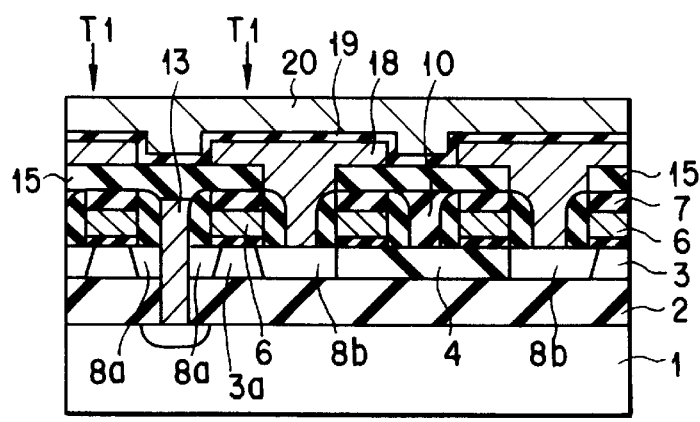
FIG. 18A is a cross-sectional view taken along line 18A—18A of FIG. 17.
Figure 18B:
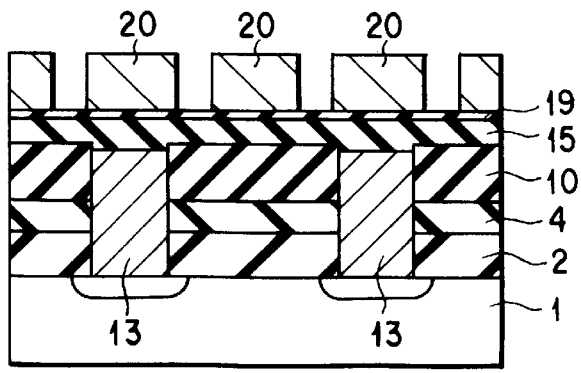
FIG. 18B is a cross-sectional view taken along line 18B—18B of FIG. 17.

FIG. 16 is an equivalent circuit diagram of one memory cell of the semiconductor memory device of the second embodiment, and FIG. 17 is a plan view of the memory cell. FIG. 18A is a cross-sectional view taken along line 18A—18A of FIG. 17, while FIG. 18B is a cross-sectional view taken along line 18B—18B of FIG. 17.

In the memory cell of the second embodiment, the plate electrode has a function of bit line and, as shown in FIG. 16, the storage electrode of the capacitor is connected to one end (source or drain electrode) of a selective transistor T1. The other end of the transistor T1 is connected to, e.g., a fixed potential Vcc. The gate electrode of the transistor T1 is connected to a word line WL.

Figure 19A:
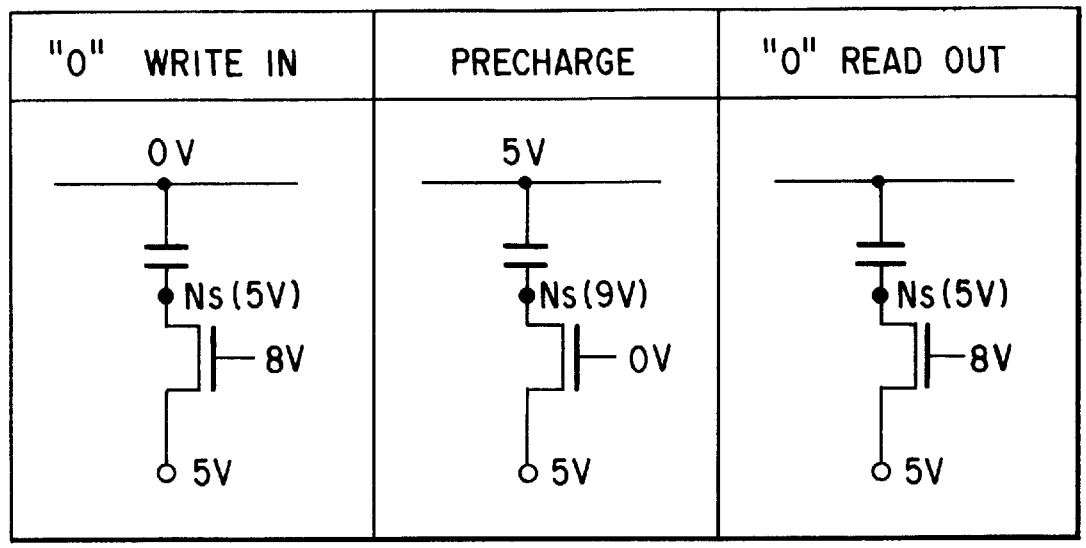
FIG. 19A is a view showing the states of voltages in writing "0", precharging and reading out "0" in the semiconductor memory device (memory cell) according to the second embodiment of the present invention.
Figure 19B:
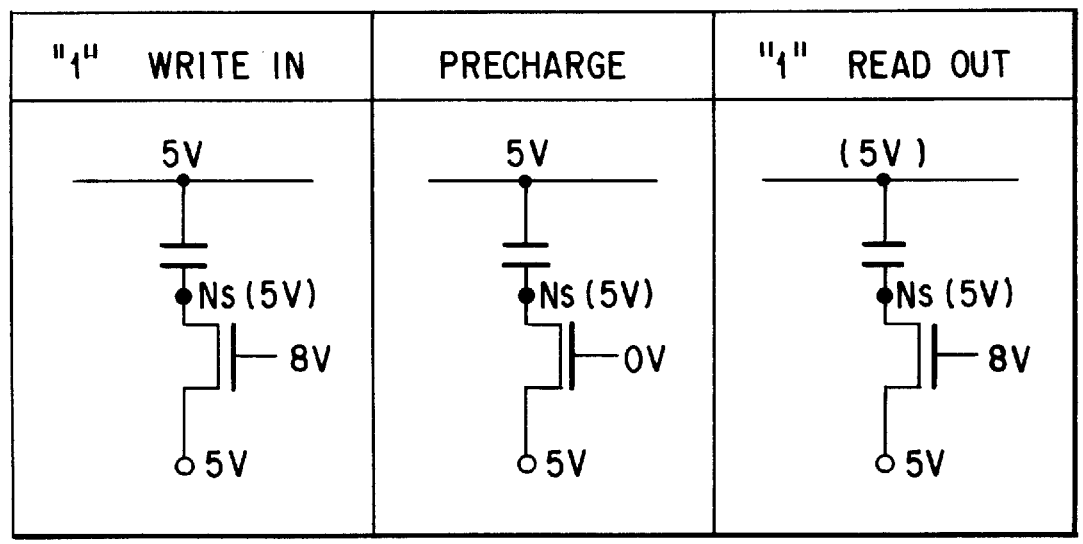
FIG. 19B is a view showing the states of voltages in writing "1", precharging and reading out "1" in the semiconductor memory device (memory cell) according to the second embodiment of the present invention.

FIGS. 19A and 19B show examples of operation voltages in write and read modes of the memory cell of the first embodiment. In these examples, Vcc is, for example a positive voltage of about 5 V.

When "0" is written, the bit line BL of a selected cell is kept at 0 V and the word line WL thereof is kept at 8 V, as shown in FIG. 19A. The transistor T1 is thus turned on, and the potential of the storage electrode becomes about 5 V.

If the word line WL is set to 0 V and the bit line BL is set to Vcc, i.e., 5 V, the potential of the storage electrode rises up to about 9 V, and the capacitor is precharged. When "0" is read out, the word line WL is set again to 8 V and thus the potential of the bit line BL becomes {5−5(5−9)×Cs/(Cs+Cb)}V. Cs is the capacitance of capacitor C1, and Cb is the parasitic capacitance of bit line BL. If the potential of the bit line BL is compared with a reference potential using a sense amplifier or the like, the data can be read out.

When "1" is written, the bit line BL of a selected cell is set to 5 V and the word line WL thereof is set to 8 V, as shown in FIG. 19B. The transistor T1 is thus turned on and the potential of the storage electrode becomes about 5 V.

If the word line WL is set to 0 V and the bit line BL is set to Vcc, i.e., 5 V, the storage electrode does not vary in potential and is precharged with about 5 V, unlike when "0" is written. When "1" is read out, the word line WL is set again to 8 V, but the potential of the bit line BL remains unchanged at 5 V.

The constitution of the memory cell of the second embodiment will now be described with reference to FIGS. 17, 18A and 18B.

The memory cell of the second embodiment includes an SOI substrate constituted of a semiconductor substrate 1, an insulation layer 2 and a semiconductor layer (element region) 3. A MOS transistor T1 having a gate electrode 6 and diffusion layers 8a and 8b is formed on the SOI substrate. While the diffusion layer 8a is connected to the semiconductor substrate 1 via a buried electrode 13, the diffusion layer 8b is connected to a storage electrode 18. An plate electrode 19 is formed on the storage electrode 18 with an insulation film 19 therebetween, thus forming a capacitor. The plate electrode 20 is patterned to serve as a bit line.

The above memory cell is featured in that the plate electrode 20 formed above the storage electrode 18 functions as a bit line 20 and the diffusion layer 8a is connected to the substrate 1 through the buried electrode 13.

As described above, the layer 20 serves as both the bit line and the plate electrode of the capacitor, and the bit line 20 is formed above the storage electrode 18. Therefore, as will be described later, since only the gate electrode 6 is present as a wiring layer between the storage electrode 18 and diffusion layer 8b when the storage electrode 18 is formed, the connecting hole 17 for the storage electrode has to be self-aligned with the gate electrode 6 only, and the storage electrode 18 can easily be prevented from being short-circuited with the gate electrode 6 and bit line 20.

Since the diffusion layer 8a is not connected to an upper wiring layer such as a conventional bit line, but to the substrate 1 formed under the insulation layer 2 under the element region 3, the wiring layers formed above the region 3 can be decreased by one. As in the first embodiment, the interlayer insulation film to be etched can be thinned when the connecting hole 17 is formed, and the connecting hole 17 can easily be self-aligned with the gate electrode 6.

Moreover, as in the first embodiment, since a difference in level can be reduced by at least the thickness of one wiring layer, a region such as a peripheral circuit region, where no storage electrode is formed, can easily be flattened, thus making it easy to pattern and etch the wiring layer.

According to the second embodiment, if a fixed potential is applied to the substrate 1 connected to the diffusion layer 8a, it can easily be applied to the diffusion layer 8a, where the fixed potential is required.

For example, if no SOI substrate is employed, a wiring layer for connecting the diffusion layer 8a need to be additionally formed, which makes it difficult to form the storage electrode 18 and causes restrictions on horizontal patterning. However, the memory cell of the second embodiment can be decreased in area since a new area for patterning is not required.

In the first embodiment, where the potential of the diffusion layer 8a is not fixed or it is connected to the bit line, the wiring layer 30 serving as the bit line has to be patterned. However, in the second embodiment, the same fixed potential (e.g., Vcc) has only to be applied to the diffusion layers 8a of all memory cells. If, therefore, the fixed potential is applied to the substrate 1, no patterning is needed, thus easily achieving reduction in cell area and simplification in manufacturing process.

In the second embodiment, since the transistor is formed on an island-like isolated element region on the SOI substrate, the potential of a bulk region 3a of the transistor is not fixed. If the transistor T1 is directly formed on the conventional substrate to form a cell circuit like this embodiment, the potential of the bulk region is fixed and thus the following problem will arise. When the potential of the bit line 20 is changed, for example, to ½ Vcc, that of the storage electrode 18 is lowered through coupling of the storage capacitor C1, the potential of the diffusion layer 8b becomes a forward bias voltage with respect to the potential of the bulk region, and the stored charges are caused to flow through the bulk region. In the second embodiment, however, the potential of the diffusion layer 8b and that of the bulk region do not make a forward bias since the potential of the isolated bulk region is lowered according to that of the diffusion layer 8b.

A method for manufacturing the above memory cell of the second embodiment will now be described. FIGS. 20A to 28A and 20B to 28B are cross-sectional views showing the manufacturing method step by step. The views of FIGS. 20A to 28A are each corresponding to the views taken along line 18A—18A of FIG. 17, while those of FIGS. 20B to 28B are each corresponding to the views taken along line 18B—18B of FIG. 17.

Figure 20A:
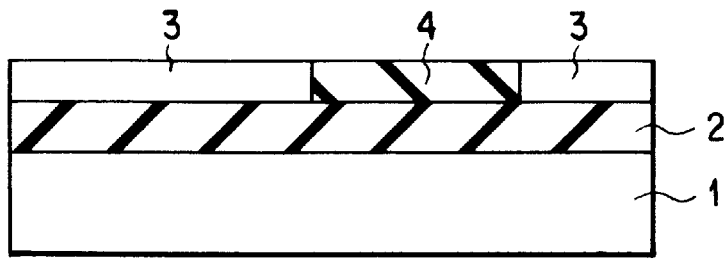
Figure 20B:
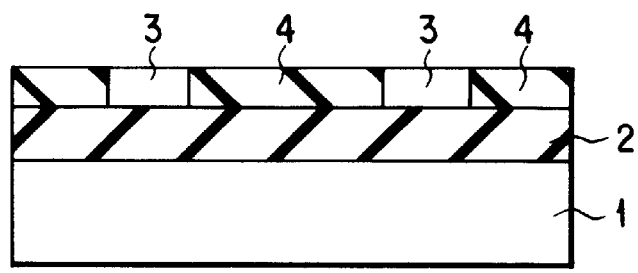
Figure 21A:
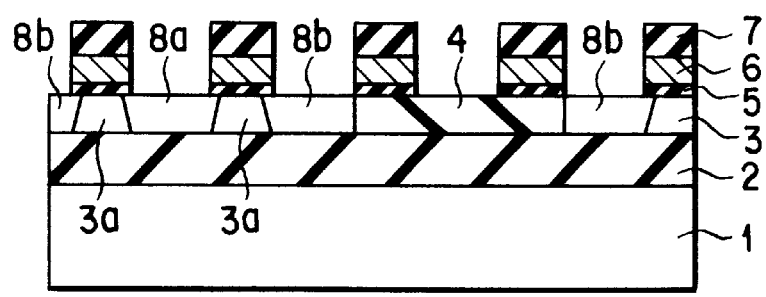
Figure 21B:
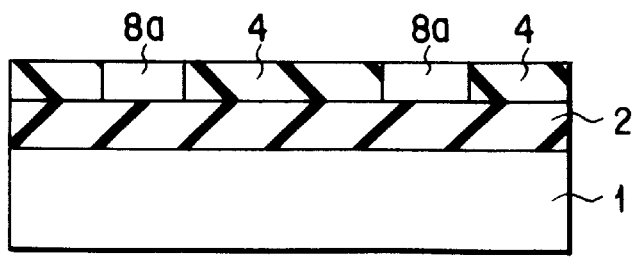

An insulation layer 2 of, e.g., SiO$_2$ is formed on a semiconductor substrate 1 such as an n-type silicon substrate, and a monocrystalline silicon layer 3 is formed on the insulation layer 2. These substrate and layers constitute an SOI substrate. Part of the layer 3 is removed, and an insulation film such as an oxide film (SiO$_2$) is buried into the removed part, with the result that an element isolation region 4 reaching the insulation layer 2 is formed and so is an island-like element region 3 surrounded with the layer 2 and region 4. (FIGS. 20A and 20B)

As in the first embodiment, a gate insulation film 5, a gate electrode 6, an insulation film 7, and source and drain diffusion layers 8a and 8b (or 8b and 8a) are formed (FIG. 21A), an insulation film 9 is formed on the side wall of the gate electrode 6 (FIG. 22A), and an interlayer insulation film 10 is buried between adjacent gate electrodes 6 (FIG. 23A).

Figure 24A:
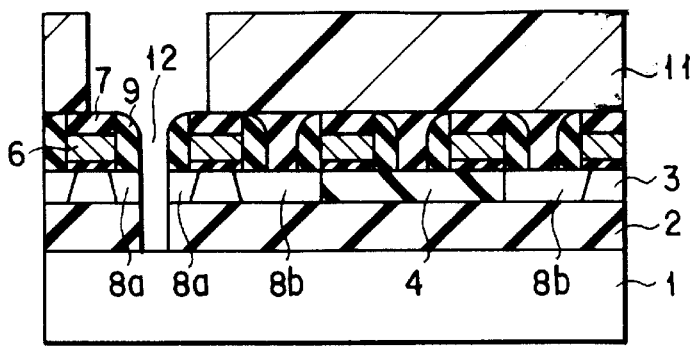
Figure 24B:
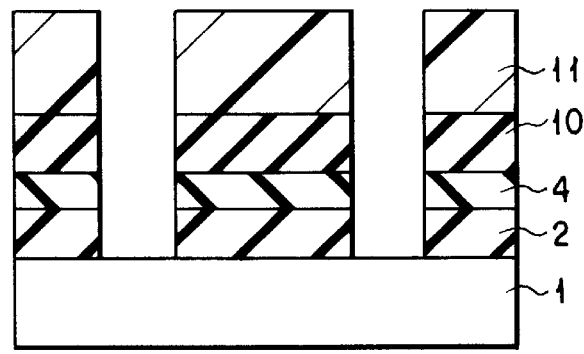

A resist film 11 having an opening is formed on the diffusion layer 8a. Using anisotropic etching such as RIE, the interlayer insulation film 10, diffusion layer 8a and insulation layer 2 are etched to form an opening 12, and the surface of the substrate 1 is selectively exposed. If an etching condition is set properly to prevent the nitride films 7 and 9 from being etched, the opening 12 is self-aligned with the gate electrode 6. (FIGS. 24A and 24B)

After the resist film 11 is removed, a polysilicon film containing, e.g., phosphorus is deposited and etched using, e.g., RIE, and the insulation film 7 and interlayer insulation film 10 are exposed. The polysilicon film is buried into the opening 12 to form a buried electrode 13.

Figure 25A:
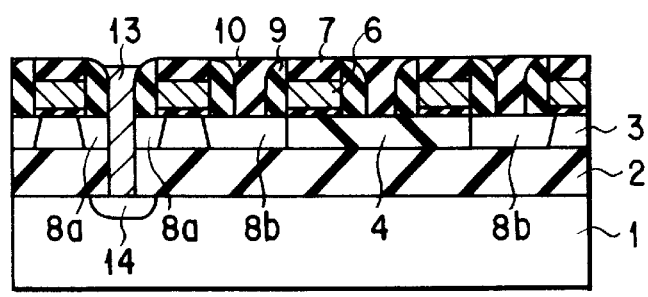
Figure 25B:
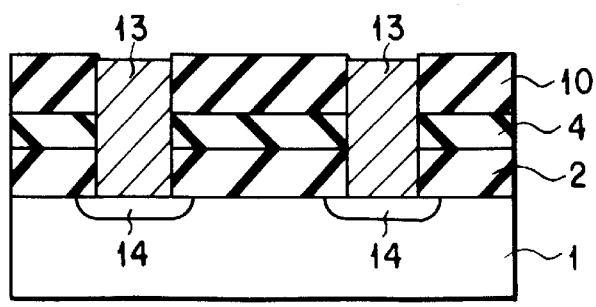

A highly-doped layer 14 is formed on the surface of the substrate 1 contacting the buried layer 13 by diffusion of impurities from the polysilicon film. The diffusion layer 8a and substrate 1 are thus connected by the buried electrode 13 (FIGS. 25A and 25B). The highly-doped layer 14 can be formed by ion-implanting phosphorus or the like after the opening 12 is formed.

Figure 26A:
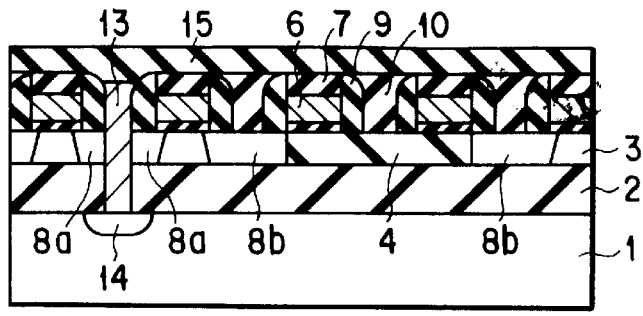
Figure 26B:
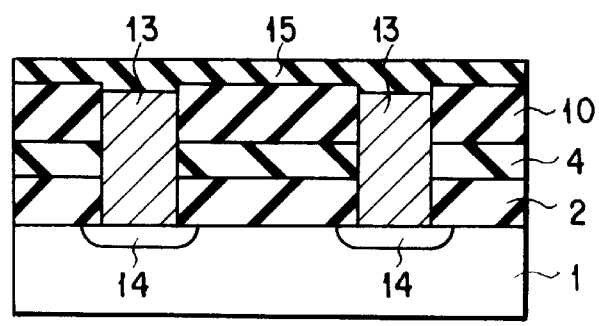

An interlayer insulation film 15 such as an oxide film (SiO$_2$) is deposited on the resultant structure. (FIGS. 26A and 26B)

Figure 27A:
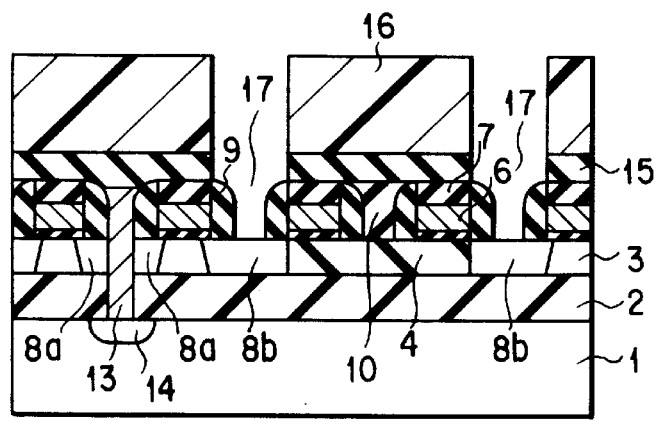
Figure 27B:
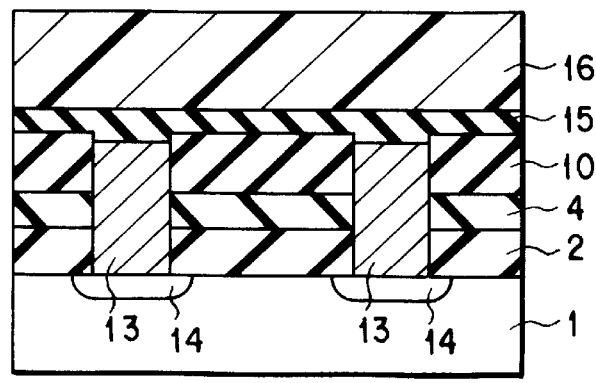

Moreover, as in the first embodiment, a resist film 16 having an opening above the diffusion layer 8b is formed on the interlayer insulation film 15, and the films 15 and 10 are etched to expose the diffusion layer 8b, thus forming a connecting hole 17 for a storage electrode. If an etching condition is set properly to prevent the nitride films 7 and 9 from being etched, the connecting hole 17 is self-aligned with the gate electrode 6. (FIGS. 27A and 27B)

Figure 28A:
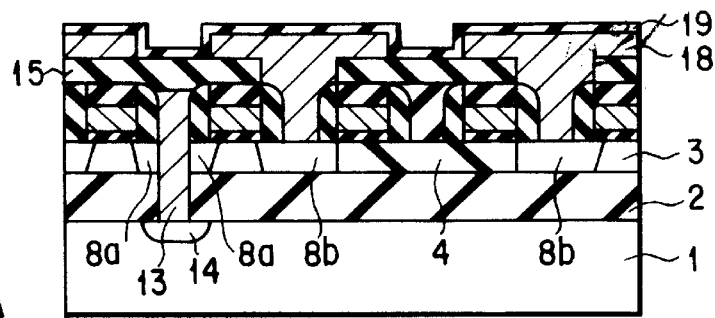
Figure 28B:
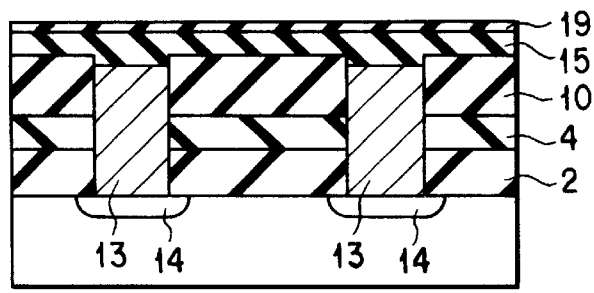

After that, as in the first embodiment, the resist film 16 is removed to form a storage electrode 18 and a capacitor insulation film 19. (FIGS. 28A and 28B)

Figure 29A:
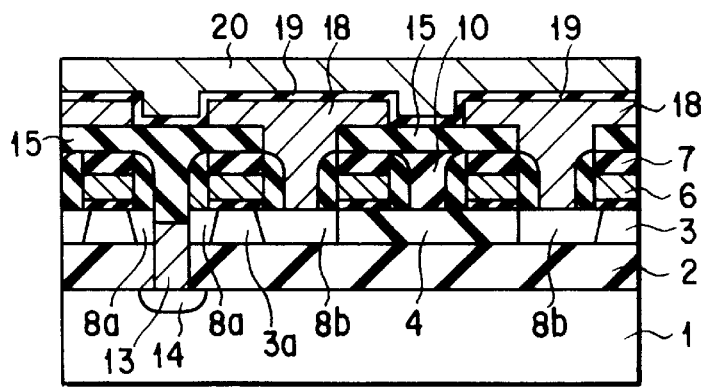
FIGS. 29A and 29B are cross-sectional views showing a modification to the semiconductor memory device according to the second embodiment of the present invention.
Figure 29B:
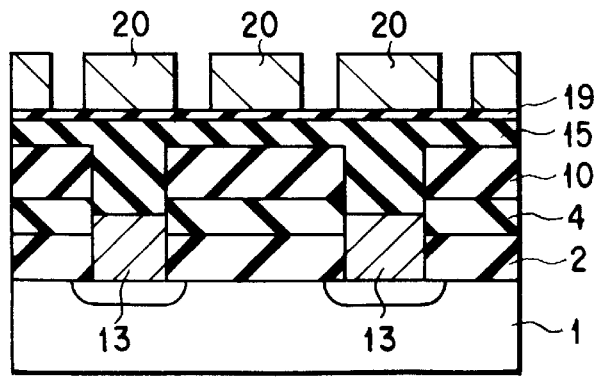
Figure 30A:
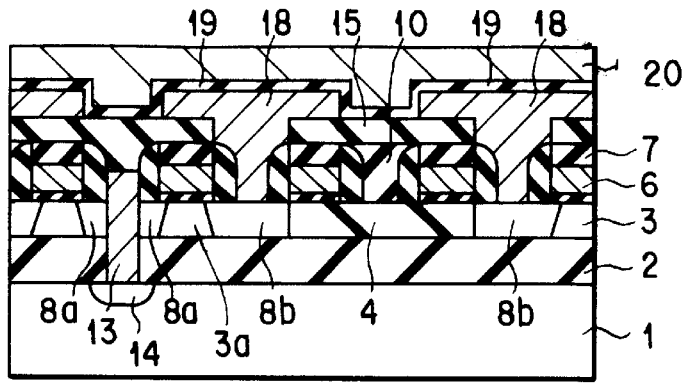
FIGS. 30A and 30B are cross-sectional views showing another modification to the semiconductor memory device according to the second embodiment of the present invention.
Figure 30B:
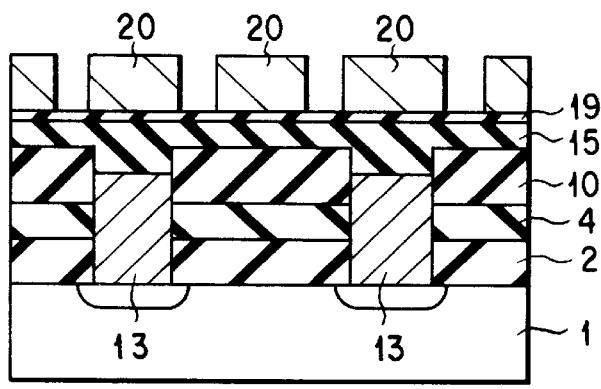

An electrode material such as a polysilicon film is deposited, and a layer 20 serving as both a bit line and a plate electrode of the capacitor is formed using conventional photolithography and anisotropic etching such as RIE. (FIGS. 29A and 29B)

Thereafter, a DRAM is completed by forming an interlayer insulation film, a wiring layer, etc. through a conventional manufacturing process.

According to the second embodiment described above, the layer 20 serves as the bit line and the plate electrode and is formed after the storage electrode 18 is done. Therefore, as shown in FIG. 27, only the gate electrode 6 is present as a lower wiring layer when the connecting hole 17 is formed. The connecting hole 17 has to be self-aligned with the gate electrode 6 only. Consequently, the possibility of short-circuiting the storage electrode 18, gate electrode 6 and bit line 20 can be reduced more greatly than in the conventional memory cell wherein the storage electrode 18, gate electrode 16 and bit line 50 should be self-aligned with each other.

According to the second embodiment, as in the first embodiment, the diffusion layer 8a can be self-aligned with the gate electrode 6, and the opening 12 can be self-aligned with the gate electrode 6 when the layer 8a is connected to the substrate 1. Therefore, no margin is newly required, and the cell area can be decreased. The first embodiment necessitates a margin for matching the opening 12 and the patterning of the bit line 30, whereas the second embodiment does not need such a margin and accordingly the cell can be miniaturized further.

In the foregoing first and second embodiments, the buried electrode 13 is formed of polysilicon containing phosphorus; however, it can be formed of refractory metal such as tungsten. Using such metal, in the second embodiment, it is desirable that the diffusion layer 14 be formed beforehand by ion-implanting phosphorus or the like into the opening 12. The buried electrode 13 can also be formed by burying metal into the opening 12 after, for example, a titanium nitride film is formed on the diffusion layer 14 as barrier metal. It is also desirable that a silicide layer of a refractory metal such as Ti is inserted between the diffusion layer 14 and the barrier metal to make an ohmic contact.

In the above embodiments, the conductive film such as a polysilicon film and a metal film is formed into the opening 12 by forming a conductive film all over the opening 12, the insulation films 7 and 10 and then removing that part of the conductive film which is formed on the insulation films 7 and 10 using RIE or CMP. However, the conductive film can be obtained by selectively growing the conductive film made of, e.g., W on the substrate 1 or the bit line 30 exposed to the opening 12.

In the above first and second embodiments, the buried electrode 13 is formed on a level with the insulation film 7 formed on the gate electrode 6. However, it need not be formed on such a level since it is used to connect the diffusion layer 8a with the substrate 1. For example, as illustrated in FIGS. 28A and 28B, the buried electrode 13 has only to be formed higher than the upper surface of the insulation film 2. It is however desirable that it be buried at least above the surface of the monocrystalline substrate 3, as shown in FIGS. 29A and 29B, in order to reduce the connecting resistance.

Figure 31A:
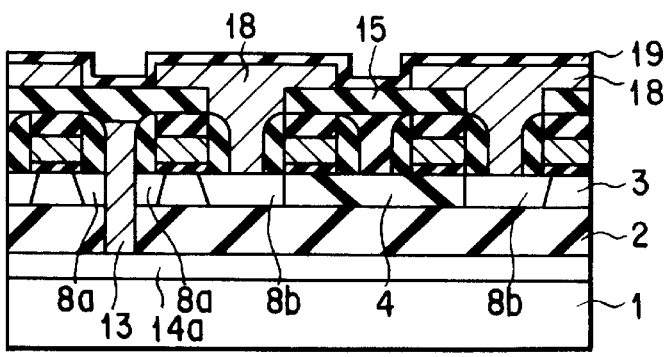
FIGS. 31A and 31B are cross-sectional views showing still another modification to the semiconductor memory device according to the second embodiment of the present invention.
Figure 31B:
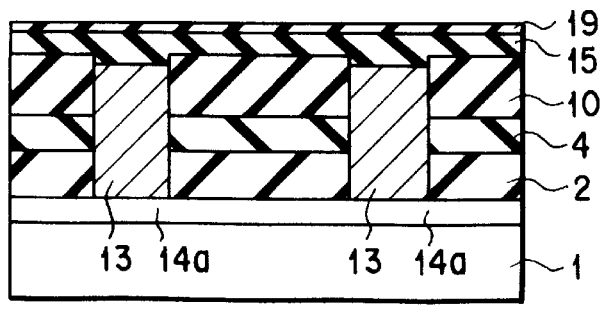
Figure 32A:
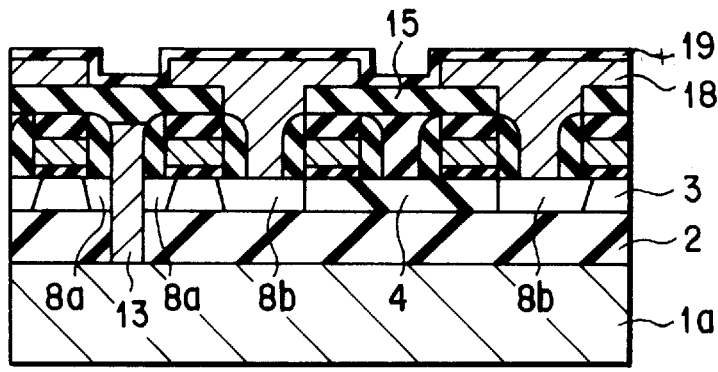
FIGS. 32A and 32B are cross-sectional views showing yet another modification to the semiconductor memory device according to the second embodiment of the present invention.
Figure 32B:
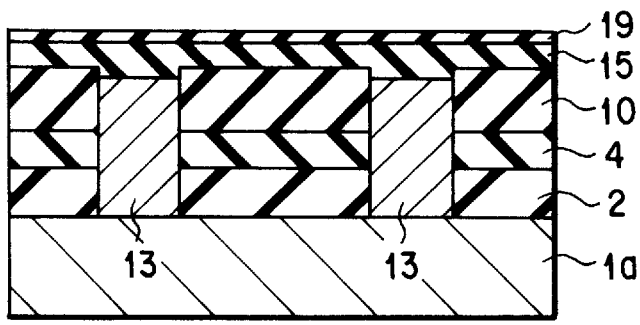

In the second embodiment, the diffusion layer 14 is formed on the substrate 1 under the opening 12 in order to achieve good connection between the buried electrode 13 and the substrate 1. However, as shown in FIGS. 31A and 31B, a diffusion layer 14a can be formed on the entire surface of the substrate 1. Otherwise, as shown in FIGS. 32A and 32B, the substrate can be replaced with a metal substrate 1a, which is to be maintained at a certain potential.

(Third Embodiment)

A method for manufacturing a memory cell according to a third embodiment of the present invention will now be described. In this method, a buried electrode 13 and an element region 3 are formed simultaneously by crystal growth before a transistor is formed. FIGS. 33A to 38A and 33B to 38B are cross-sectional views for explaining the steps of manufacturing the memory cell of the third embodiment.

Figure 33A:
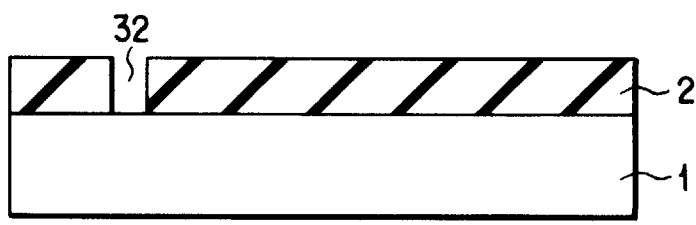
Figure 33B:
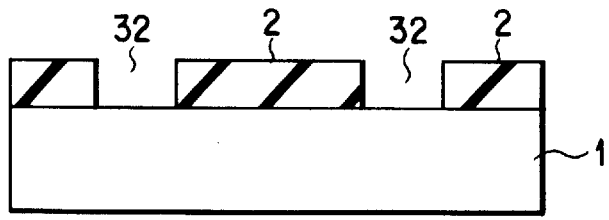

An insulation layer 2 such as an oxide film (SiO$_2$) is formed on a semiconductor substrate 1 such as a silicon substrate, and an opening 32 is formed in the insulation layer 2 to expose the substrate 1. (FIGS. 33A and 33B).

Figure 34A:
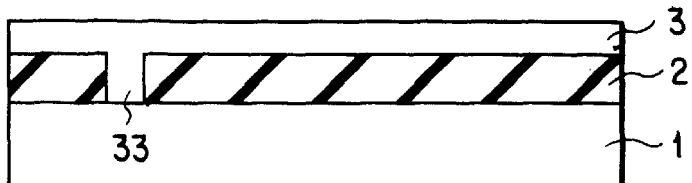
Figure 34B:
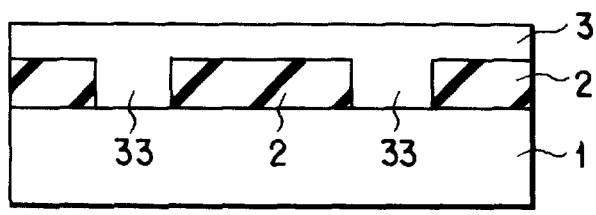

Using the monocrystalline face of the exposed substrate 1 as a seed crystal, a buried electrode 33 and a monocrystalline substrate 3 are epitaxially grown at the same time. (FIGS. 34A and 34B)

Figure 35A:
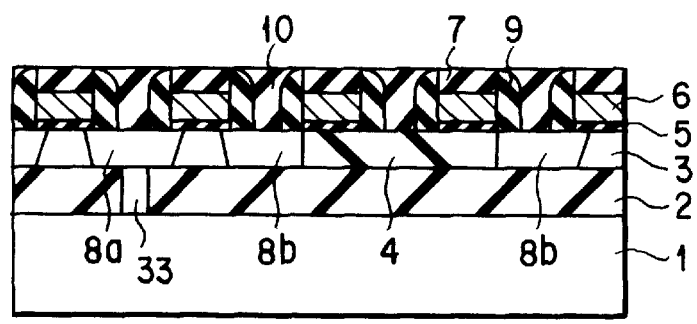
Figure 35B:
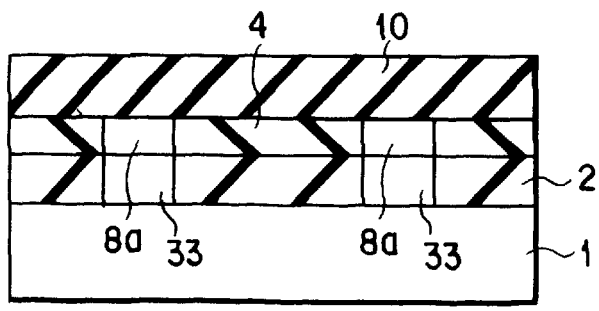

After that, as in the second embodiment, an element isolation region 4, a gate electrode 6, diffusion layers 8a and 8b, a sidewall insulation film 9 and an interlayer insulation film 10 are formed (FIGS. 35A and 35B). The diffusion layer 8a is formed on the buried electrode 33.

At this time, the diffusion layer 8a and substrate 1 are already connected to each other, though in the second embodiment they have to be connected by forming the opening 12 and buried electrode 13.

Figure 36A:
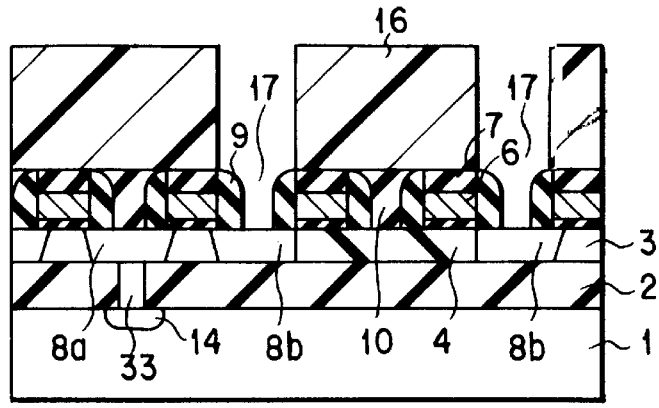
Figure 36B:
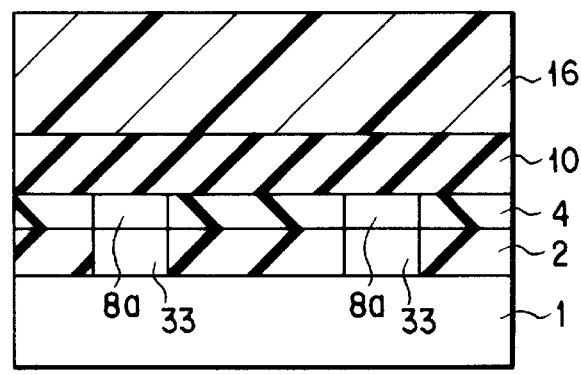

After that, a resist film 16 having an opening located above the diffusion layer 8b, is formed and the interlayer insulation film 10 is etched and the diffusion layer 8b is exposed, thus forming a connecting hole 17 for a storage electrode. If an etching condition is set properly to prevent the nitride films 7 and 9 from being etched, the connecting hole 17 is self-aligned with the gate electrode 6. (FIGS. 36A and 36B)

Figure 37A:
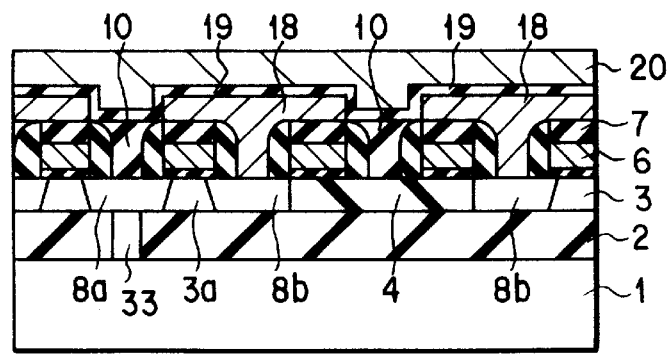
Figure 37B:
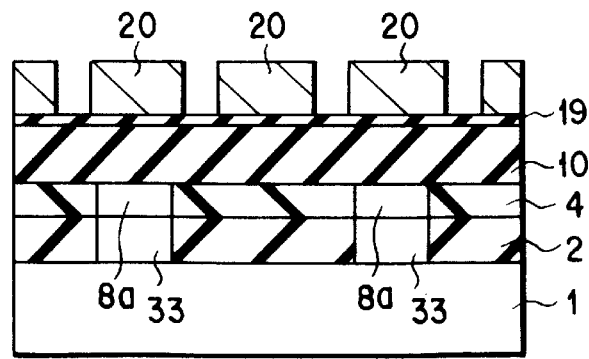

Thereafter, as in the second embodiment, a storage electrode 18, a capacitor insulation film 19, and a layer 20 serving as both a plate electrode and a bit line are formed (FIGS. 37A and 37B).

As described above, in the third embodiment, the buried electrode 33 and monocrystalline substrate 3 are formed at once by epitaxial growth. The step can thus be executed more simply than that of the second embodiment in which the opening 12 is formed through the substrate 3 and layer 2 and the buried electrode 13 is formed thereinto.

Since the substrate 1 and monocrystalline substrate 3 are connected to each other by the buried electrode 33 before the gate electrode 6 is formed, the short circuit between the buried electrode and gate electrode can be prevented more completely than in the first and second embodiments wherein the gate electrode 6 is formed and then the opening 12 is self-aligned therewith.

In the first and second embodiments, the interlayer insulation film 15 has to be formed to prevent the short circuit between the buried electrode 13 and storage electrode 18. In the third embodiment, since they can be insulated by the interlayer insulation film 10 formed between the gate electrodes 6, the step of forming the film 15 can be deleted.

Figure 38A:
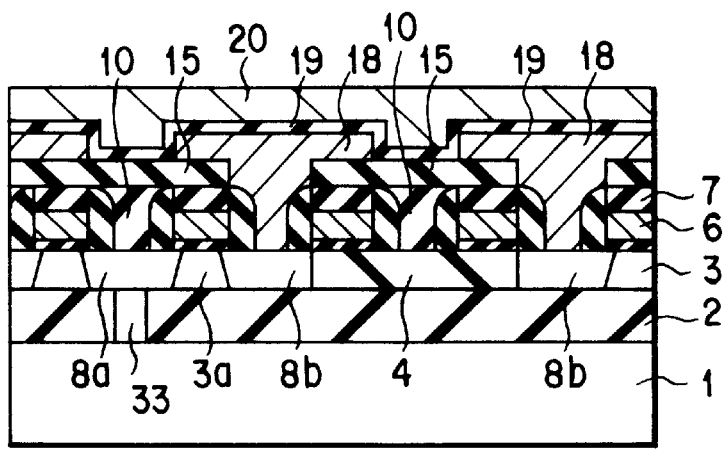
Figure 38B:
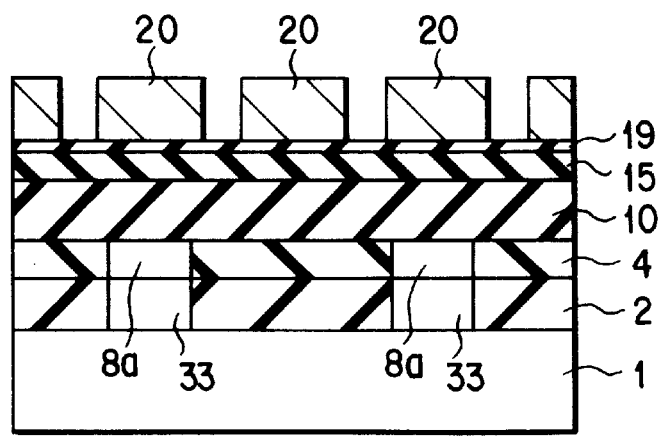

Since, in the third embodiment, no interlayer insulation film is required, the insulation film to be etched when the connecting hole 17 is formed, can be decreased in thickness and accordingly the short circuit between the storage electrode 18 and gate electrode 6 can be prevented more reliably than in the second embodiment. If necessary, the interlayer insulation film 15 can be formed, as shown in FIGS. 38A and 38B.

According to the third embodiment, the connecting resistance can be lowered by properly introducing impurities into the storage electrode 33 by ion implantation, auto-doping from the substrate 1, or the like.

In the third embodiment, the silicon mono-crystalline growing system is applied to the second aspect of the present invention in which the plate electrode is used as a bit line. This system can be applied to the first aspect wherein the bit line is formed under the SOI insulation film and, in this case, predetermined doping is required for the silicon monocrystal serving as the bit line.

In addition to the above three embodiments, for example, germanium is ion-implanted into the source/drain diffusion regions 8a and 8b of the transistor T1 to form a hetero junction between the diffusion regions and bulk region 3a, thus making it possible to decrease the punch through current of the transistor. By properly setting the thickness of the element region, the material of the gate electrode, the material and thickness of the gate insulation film, the impurity distribution of the diffusion layer or bulk region, etc., the transistor can be improved in performance.

The above semiconductor memory device of the present invention includes a transistor having a considerably large capacitor area, a sufficiently high element isolation withstand voltage, and excellent controllability, and prevents the storage electrode from being short-circuited with the gate electrode and bit line.

According to the above-described method for manufacturing the semiconductor memory device of the present invention, a transistor having a considerably large capacitor area, a sufficiently high element isolation withstand voltage, and excellent controllability can easily be achieved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a substrate;

a first insulation layer formed on said substrate;

a plurality of separated bit lines arranged to extend in one direction on said first insulation layer;

a second insulation layer formed over all of said plurality of bit lines and having a plurality of openings extending through the second insulation layer;

a plurality of via conductive layers buried into at least said plurality of openings;

an element isolating region formed on said second insulation layer;

a plurality of element forming semiconductor regions each of said element forming semiconductor regions being formed as an island surrounded by said element isolating region;

a plurality of transistors formed in said plurality of element forming semiconductor regions, each of said plurality of transistors including, a gate electrode formed on an insulating layer over a corresponding one of said plurality of element forming semiconductor regions, said gate electrode extending in a direction crossing said plurality of bit lines and serving as a word line, a gate side wall insulator provided on each of two opposite facing side walls of said gate electrode, a first and second diffusion region formed in said corresponding one of said plurality of element forming semiconductor regions, each said first and second diffusion region being adjacent to one of the two opposite facing side walls of said gate electrode and extending in a direction crossing said word line, said first diffusion region being connected to a corresponding one of said plurality of bit lines through a corresponding one of said plurality of via conductive layers;

a plurality of capacitors corresponding to said plurality of transistors, each of said plurality of capacitors including, a storage electrode formed on said second diffusion region, said storage electrode being electrically connected to said second diffusion region, a capacitor insulation film formed on said storage electrode, and a plate electrode formed on said capacitor insulation film, said plate electrode being connected in common to said plurality of capacitors; and wherein each of said plurality of openings has a side wall having a portion which is vertically aligned with an outer surface of a corresponding said gate side wall insulator of a corresponding one of said plurality of transistors.

2. The semiconductor memory device according to claim 1, wherein said plurality of bit lines are formed of tungsten.

3. The semiconductor memory device according to claim 1, wherein said plurality of bit lines are formed of monocrystalline silicon, and said plurality of element forming semiconductor regions and said plurality of via conductive layers are formed integrally with said plurality of bit lines as a monocrystalline layer.

4. A semiconductor memory device comprising:

a substrate;

an insulation layer formed on said substrate and having a plurality of openings;

a plurality of via conductive layers buried into at least said plurality of openings;

an element isolating region formed on said insulation layer;

a plurality of element forming semiconductor regions, each of said element forming semiconductor regions being formed as an island surrounded by said element isolating region;

a plurality of transistors formed in said plurality of element forming semiconductor regions, each of said plurality of transistors including, a gate electrode formed on an insulating layer over a corresponding one of said plurality of element forming semiconductor regions, said gate electrode extending in a predetermined direction and serving as a word line, a gate side wall insulator provided on each of two opposite facing side walls of said gate electrode, wherein each of said plurality of openings has a side wall having a portion which is vertically aligned with an outer surface of a corresponding said gate side wall insulator of a corresponding one of said plurality of transistors, a first and second diffusion region formed in said corresponding one of said plurality of element forming semiconductor regions, each said first and second diffusion region being adjacent to one of two opposite facing side walls of said gate electrode and extending in a direction crossing the word line, said first diffusion region being connected to said substrate through a corresponding one of said plurality of via conductive layers; and a plurality of capacitors corresponding to said plurality of transistors, each of said plurality of capacitors including, a storage electrode formed on said second diffusion region, said storage electrode being electrically connected to said second diffusion region, a capacitor insulation film formed on at least said storage electrode, and a plate electrode formed on said capacitor insulation film, said plate electrode extending in a direction crossing said word line and serving as a bit line.

5. The semiconductor memory device according to claim 4, wherein said substrate is formed of silicon, and said plurality of via conductive layers are formed of one of polysilicon and tungsten.

6. The semiconductor memory device according to claim 5, wherein a third diffusion region is selectively formed in a portion of said substrate under said one of said plurality of via conductive layers and connected thereto.

7. The semiconductor memory device according to claim 4, wherein said substrate is formed of monocrystalline silicon, and said plurality of element forming semiconductor regions and said plurality of via conductive layers are formed integrally with said substrate as a monocrystalline layer.

8. The semiconductor memory device according to claim 1, wherein each of said plurality of via conductive layers has a portion protruding from an upper surface of said second insulation layer which is connected to said first diffusion region of a corresponding one of said plurality of transistors, and said protruding portion also has a side wall having a portion which is vertically aligned with said outer surface of said corresponding gate side wall insulator of said corresponding one of said plurality of transistors.

9. A semiconductor memory device comprising:

a substrate;

a first insulation layer formed on said substrate;

a plurality of separated bit lines arranged to extend in one direction on said first insulation layer;

a second insulation layer formed over all of said plurality of bit lines and having a plurality of openings extending through the second insulation layer;

a plurality of via conductive layers having a portion buried into at least said plurality of openings and a protruding portion extending from an upper surface of said second insulation layer;

an element isolating region formed on said second insulation layer;

a plurality of element forming semiconductor regions, each of said element forming semiconductor regions being formed as an island surrounded by said element isolation region;

a plurality of transistors formed in said plurality of element forming semiconductor regions, each of said plurality of transistors including, a gate electrode formed on an insulating layer over a corresponding one of said plurality of element forming semiconductor regions, said gate electrode extending in a direction crossing said plurality of bit lines and serving as a word line, a gate side wall insulator provided on each of two opposite facing side walls of said gate electrode, a first and second diffusion region formed in said corresponding one of said plurality of element forming semiconductor regions, each said first and second diffusion region being adjacent to one of the two opposite facing side walls of said gate electrode and extending in a direction crossing said word line, said first diffusion region being connected to a corresponding one of said plurality of bit lines through a corresponding buried portion of a corresponding one of said plurality of via conductive layers;

a plurality of capacitors corresponding to said plurality of transistors, each of said plurality of capacitors including,
  a storage electrode formed on said second diffusion region, said storage electrode being electrically connected to said second diffusion region,
  a capacitor insulation film formed on said storage electrode, and
  a plate electrode formed on said capacitor insulation film, said plate electrode being connected in common to said plurality of capacitors; and wherein a side surface of said protruding portion of each of said plurality of via conductive layers is in contact with at least one of said first and said second diffusion region of each of said plurality of transistors.

* * * * *